(12) United States Patent
Sasaki et al.

(10) Patent No.: US 7,511,594 B2
(45) Date of Patent: Mar. 31, 2009

(54) NOISE FILTER AND NOISE FILTER ARRAY

(75) Inventors: Soitsu Sasaki, Sabae (JP); Tomohiro Sasaki, Fukui (JP); Haruhiko Ueno, Sabae (JP); Shigekatsu Yamamoto, Echizen (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 221 days.

(21) Appl. No.: 10/596,870

(22) PCT Filed: Jul. 29, 2005

(86) PCT No.: PCT/JP2005/013956

§ 371 (c)(1),
(2), (4) Date: Jun. 28, 2006

(87) PCT Pub. No.: WO2006/022115

PCT Pub. Date: Mar. 2, 2006

(65) Prior Publication Data

US 2007/0001782 A1    Jan. 4, 2007

(30) Foreign Application Priority Data

Aug. 25, 2004  (JP) ............................ 2004-245828
Jan. 31, 2005  (JP) ............................ 2005-024105

(51) Int. Cl.
*H03H 7/46* (2006.01)
(52) U.S. Cl. ........................................ 333/132; 333/180
(58) Field of Classification Search .............. 333/132, 333/172, 181–184
See application file for complete search history.

(56) References Cited

U.S. PATENT DOCUMENTS

| | | | | |
|---|---|---|---|---|
| 5,530,411 A | * | 6/1996 | Nakata et al. | 333/185 |
| 5,583,470 A | | 12/1996 | Okubo | |
| 6,583,687 B2 | * | 6/2003 | Nosaka | 333/175 |
| 6,903,628 B2 | * | 6/2005 | Liu | 333/170 |
| 7,091,800 B2 | * | 8/2006 | Yamamoto et al. | 333/185 |
| 7,327,207 B2 | * | 2/2008 | Asakawa | 333/175 |
| 2002/0030561 A1 | | 3/2002 | Masuda et al. | |

FOREIGN PATENT DOCUMENTS

JP      05-267059 A    10/1993

(Continued)

OTHER PUBLICATIONS

Official communication issued in the counterpart Korean Application No. 10-2006-7012772, mailed on Mar. 30, 2007.

(Continued)

*Primary Examiner*—Don P Le
(74) *Attorney, Agent, or Firm*—Keating & Bennett, LLP

(57) ABSTRACT

A noise filter includes a plurality of LC parallel resonant circuits having a plurality of coils which are connected in series and electrically connected to external electrodes at both ends thereof, and capacitors which are connected in parallel to the coils, respectively, and are disposed inside an insulator while being sequentially connected in tandem to signal wires. Resonance frequencies of the respective LC parallel resonant circuits are preferably different from each other. Further, a shield electrode is disposed between the coils, and the shield electrode also defines a capacitance-forming electrode for preventing magnetic coupling between the two coils.

19 Claims, 14 Drawing Sheets

FOREIGN PATENT DOCUMENTS

| | | |
|---|---|---|
| JP | 07-022243 A | 1/1995 |
| JP | 07-202616 A | 8/1995 |
| JP | 09-294040 A | 11/1997 |
| JP | 10-065476 A | 3/1998 |
| JP | 11-205063 A | 7/1999 |
| JP | 2000-059168 A | 2/2000 |
| JP | 2000-151324 A | 5/2000 |
| JP | 2002-094349 A | 3/2002 |

OTHER PUBLICATIONS

International Search Report issued in the corresponding International Application No. PCT/JP2005/013956, mailed on Oct. 25, 2005.

Official communication issued in counterpart Chinese Application No. 200580003308.0, mailed on Jun. 27, 2008.

* cited by examiner

NOISE FILTER AND NOISE FILTER ARRAY

BACKGROUND OF THE INVENTION

1. Field of the Invention

The present invention relates to a noise filter for effectively removing noise flowing in a signal wire disposed on a circuit board, and a noise filter array.

2. Description of the Related Art

Depending on the communication system of a portable telephone, for example, a single portable telephone may use a plurality of communication bands. In order to prevent degradation of reception sensitivity in each of the communication bands, it is necessary to effectively remove noise in each frequency band.

Known examples of a noise filter used for such noise removal include a choke coil, a ferrite bead, and a ladder-type LC filter.

When the choke coil mentioned above is used as the noise filter, noise countermeasures can be easily implemented because noise can be removed by simply connecting the choke coil to each signal wire. However, the choke coil can only remove noise at a specific frequency because the band for which noise removal can be performed is relatively narrow, which disadvantageously makes it difficult to remove noises in a plurality of frequency bands at the same time.

Further, when a ferrite bead is used, as in the case of the choke coil, noise countermeasures can be easily implemented because noise can be removed by simply connecting the ferrite bead to each signal wire. However, since a ferrite bead removes noise even in a low frequency band, it exerts a large influence on the signal waveform such as by attenuating a necessary signal. Further, since high attenuation cannot be attained, it may be impossible to achieve a satisfactory noise removal effect.

Further, the ladder type LC filter mentioned above comes in various types, such as a T type, a π type, or an L type. Although any one of the above-described types of ladder type LC filter can provide wide-band noise removal characteristics through appropriate setting of the inductance and capacitance, since it is necessary to ground an external electrode connected to a capacitor, it is essential to form a grounding electrode pattern on a circuit board to which the ladder type LC filter is mounted. This disadvantageously limits the freedom of wiring layout on the circuit board.

Further, while a plurality of signal wires are formed on a circuit board involving high-density mounting, depending on the component layout, it may be difficult to form grounding electrode patterns having a sufficient line width together with these signal wires. As a result, due to the influence of a parasitic inductance in the grounding electrode patterns, the frequency characteristics of the ladder type LC filter change, which disadvantageously makes it impossible to remove noise in a satisfactory manner.

On the other hand, in the related art, there has been proposed a noise filter constructed as follows (see, for example, Japanese Unexamined Patent Application Publication No. 5-267059). That is, the noise filter includes a filter element composed of one trap circuit formed by the inductance of a coil, which is composed of a plurality of coil conductors laminated in a spiral fashion within a dielectric, and a floating capacitance between the coil conductors. On either side of this element, a filter element composed of one trap circuit formed by the inductance of a coil, which is composed of a plurality of coil conductors laminated in a spiral fashion within a magnetic material, and a floating capacitance between the coil conductors, is arranged, and these filter elements are integrated with each other to thereby form the noise filter.

According to this noise filter, the resonance frequency of the trap circuit constituting each of the filter elements is set to correspond with each of a plurality of communication bands, thereby making it possible to remove noise in each of the communication bands.

However, in the noise filter described in Japanese Unexamined Patent Application Publication No. 5-267059, since not only the resonance frequency on the high frequency side but also that on the low frequency side is dependent on the floating capacitance generated between the coil conductors, it is not always easy to perform noise removal in an appropriate and satisfactory manner for each frequency band.

That is, in an LC parallel resonant circuit, the resonance frequency is dependent on the value of the LC product; the larger the LC product, the smaller the resonance frequency. Here, the setting of the resonance frequency on the high frequency side can be readily realized by adjusting the floating capacitance because the LC product may be set to be small. On the other hand, for the setting of the resonance frequency on the low frequency side, the LC product must be set to be relatively large. In this case, since problems such as distortion of the signal waveform occur when the value of the inductance L is set too large, there is naturally a limit as to how large the value of the inductance L can be set. Therefore, in order to compensate for the shortage of the inductance L, it is necessary to obtain a relatively large floating capacitance by reducing the inter-layer distance between the coil conductors or by changing the insulation material.

However, when the inter-layer distance between the coil conductors is reduced as described above, this causes deterioration in characteristics or reliability. Further, in the case where the insulation material is changed, there is a problem in that the number of manufacturing man-hours increases due to the occurrence of delamination depending on the characteristics of the material or due to an increase in the kinds of sheets to be used. In the case of Japanese Unexamined Patent Application Publication No. 5-267059, in particular, because it is necessary to fire the dielectric and the magnetic material at the same time for integration, there is a problem in that not only is the reliability in terms of strength low due to cracks, peels, or the like that are liable to occur during the manufacturing process, but also an increase in cost is caused due to the necessity of setting and managing the optimum manufacturing conditions with high precision.

Further, in the related art, there has been also proposed a construction in which a plurality of coils each composed of a plurality of coil conductors laminated in a spiral fashion within a single dielectric are formed at the same time to thereby form a plurality of trap circuits.

However, as in the case of Japanese Unexamined Patent Application Publication No. 5-267059 described above, also in the case of the noise filter of this construction, it is difficult to set each trap circuit to a desired frequency in correspondence with a plurality of communication bands, and further, there maybe cases where the coils tend to readily magnetically couple with each other. Thus, a plurality of trap circuits cannot be formed or high attenuation cannot be attained at the resonance frequency of each trap circuit, which disadvantageously makes it impossible to perform noise removal in an appropriate and satisfactory manner for each frequency band.

SUMMARY OF THE INVENTION

In order to overcome the problems described above, preferred embodiments of the present invention provide a noise filter which makes it possible to easily and reliably set a resonance frequency in each of a plurality of frequency bands and which is capable of efficiently removing noise in each of the plurality of frequency bands, and also, a noise filter which makes it possible to attain a high attenuation at each resonance frequency by reliably preventing magnetic coupling between the coils, and a noise filter array including such a noise filter.

According to a preferred embodiment of the present invention, a noise filter for removing noise flowing in a signal wire located on a circuit board includes a pair of external electrodes that are connected to the signal wire and disposed on an outside of an insulator, and on an inside of the insulator, a plurality of coils are connected in series and have both ends thereof electrically connected to the external electrodes, respectively, and a capacitor is connected in parallel to at least one of the plurality of coils, the coils each being defined by a plurality of coil conductors which are laminated through the insulator and connected to each other in a spiral configuration through a via hole, and the capacitor is defined by a shield electrode and a capacitance-forming electrode arranged so as to be opposed to each other through the insulator, the shield electrode being located between upstream and downstream coils and commonly electrically connected to both the upstream and downstream coils, the capacitance-forming electrode being electrically connected to one of the pair of external electrodes.

According to another preferred embodiment of the present invention, a noise filter for removing noise flowing in a signal wire located on a circuit board includes a pair of external electrodes that are connected to the signal wire and that are located on an outside of an insulator, and on an inside of the insulator, a plurality of coils are connected in series and have both ends thereof electrically connected to the external electrodes, respectively, and a capacitor is connected in parallel to at least one of the plurality of coils, the coils are each defined by a plurality of coil conductors which are laminated through the insulator and connected to each other in a spiral configuration through a via hole, and the capacitor is defined by the coil conductors and a capacitance-forming electrode arranged so as to be opposed to each other through the insulator, the capacitance-forming electrode being electrically connected to one of the pair of external electrodes.

In this preferred embodiment of the present invention, a shield electrode is preferably disposed between upstream and downstream coils so as to be substantially perpendicular to a coil axis direction.

Further, according to another preferred embodiment of the present invention, a noise filter for removing noise flowing in a signal wire located on a circuit board includes a pair of external electrodes that are connected to the signal wire and are located on an outside of an insulator, and on an inside of the insulator, a plurality of coils are connected in series and have both ends thereof electrically connected to the external electrodes, respectively, and a capacitor is connected in parallel to at least one of the plurality of coils, the coils are each defined by a plurality of coil conductors which are laminated through the insulator and connected to each other in a spiral configuration through a via hole, and the capacitor is defined by the pair of external electrodes and a shield electrode arranged so as to be opposed to each other through the insulator, the shield electrode being located between upstream and downstream coils and electrically connected to both the upstream and downstream coils.

It is preferred that the shield electrode is arranged so as to have a surface area that is equal to or larger than about ½ of a surface area of a bore of at least one of the upstream and downstream coils.

It is also preferable that a plurality of LC parallel resonant circuits having different respective resonance frequencies are defined by the coils and the capacitor which is individually connected in parallel to each of the coils.

It is also preferred that an LC parallel resonant circuit on a low frequency side is defined by the coil, the capacitor connected in parallel to the coil, and a floating capacitor generated due to the presence of the coil, and an LC parallel resonant circuit on a high frequency side is defined by the coil and a floating capacitor generated due to the presence of the coil.

According to another preferred embodiment of the present invention, a noise filter array includes a plurality of the noise filters according to any of the above-described preferred embodiments that are integrated together while being arranged in an array individually in correspondence with a plurality of signal wires located on a circuit board.

In such a construction, connecting points between the coils provided to each of the signal wires are preferably commonly connected together in an ungrounded state via a noise dispersing capacitor.

In the noise filter according to a preferred embodiment of the present invention, the plurality of LC parallel resonant circuits are disposed within the insulator while being sequentially connected in series to the signal wire. Accordingly, by setting the resonance frequencies of the respective LC parallel resonant circuits to be different from each other, it is possible to effectively remove noise for each of the plurality of frequency bands.

Accordingly, by using the noise filter according to various preferred embodiments of the present invention, noise countermeasures for portable telephones, for example, can be effectively implemented.

Further, the coils used are preferably of a laminated type, and the capacitor is defined by the shield electrode being located between the upstream and downstream coils and commonly electrically connected to both the coils, and one of the two external electrodes so as to be opposed to each other through the insulator. Accordingly, the coil and capacitor for defining each LC parallel resonant circuit can have a relatively simple construction. Further, a desired resonance frequency can be readily set by adjusting the capacitance of the capacitor, varying the numbers of turns of the coil conductors, or varying the distance between the coil conductors.

Further, since the LC parallel resonant circuits each including the coil and capacitor are disposed within a single insulator, it is possible to provide a highly reliable noise filter array that is free from structural flaws with relatively little fear of cracks or peels occurring during the manufacture thereof.

Further, the plurality of LC parallel resonant circuits can be formed to have a relatively simple construction also in the case where, as in various preferred embodiments of the present invention, a laminated type coil is preferably used as the coil, and the capacitor is constructed by arranging the coil conductor and the capacitance-forming electrode, which is electrically connected to one of the two external electrodes, so as to be opposed to each other through the insulator. Further, a desired resonance frequency can be readily set by adjusting the capacitance of the capacitor, varying the numbers of turns of the coil conductors, or varying the distance between the coil conductors. Accordingly, noise can be effectively removed for each frequency band.

Further, when the shield electrode is disposed between the upstream and downstream coils so as to be substantially perpendicular to the coil axis direction, magnetic coupling between the upstream and downstream coils can be reliably prevented, whereby the setting of the resonance frequency for each LC parallel resonant circuit can be performed with reliability.

Further, the plurality of LC parallel resonant circuits can be formed to have a relatively simple construction also in the case where, a laminated type coil is used as the coil, and the capacitor is constructed by arranging one of the two external electrodes and the shield electrode, which is located between the upstream and downstream coils and commonly electrically connected to both the coils, so as to be opposed to each other through the insulator. Further, a desired resonance frequency can be readily set by adjusting the capacitance of the capacitor, varying the numbers of turns of the coil conductors, or varying the distance between the coil conductors. Therefore, noise can be effectively removed for each frequency band.

When the shield electrode is set so as to have a surface area that is equal to or larger than about ½ of the bore of at least one of the upstream and downstream coils, the magnetic coupling between the upstream and downstream coils can be prevented even more reliably.

Accordingly, the trap attenuation in each of the plurality of frequency bands can be very large without varying the resonance frequencies of the respective LC parallel resonant circuits. As a result, noise can be removed even more effectively.

When the plurality of LC parallel resonant circuits having respective resonance frequencies that differ from each other are defined by the coils and the capacitor individually connected in parallel to each of the coils, the resonance frequency of each of the LC parallel resonant circuits can be reliably and readily adjusted or controlled to a desired frequency by appropriately setting the inductance of the coil and the capacitance of the capacitor. Accordingly, noise removal can be performed in a satisfactory manner for each frequency band.

Also in the case where the LC parallel resonant circuit on the low frequency side is defined by the coil, the capacitor connected in parallel to the coil, and the floating capacitor generated due to the presence of the coil, and the LC parallel resonant circuit on the high frequency side is defined by the coil and the floating capacitor generated due to the presence of the coil, noise removal can be performed in a satisfactory manner for each frequency band despite the even more simplified construction. That is, with respect to the LC parallel resonant circuit on the low frequency side, a somewhat large LC product can be set by the coil and the capacitor, whereby noise on the low frequency side can be removed in a satisfactory manner. Further, with respect to the LC resonant circuit on the high frequency side, since the LC product may be set smaller than that on the low frequency side, noise on the high frequency side can be removed in a satisfactory manner by adjusting the coil and the floating capacitor generated due to the coil.

Further, in the noise filter array according to a preferred embodiment of the present invention, a plurality of the noise filters according to any of the preferred embodiments of the present invention described above are integrated together while being arranged in an array individually in correspondence with the plurality of signal wires disposed on the circuit board. Accordingly, noise in each of the plurality of signal wires can be removed by a single component (an array noise filter). Accordingly, it is not necessary to provide noise filters individually in correspondence with the respective signal wires, whereby in addition to a reduction in the number of components as compared with the prior art, it is possible to achieve an improvement in the efficiency of mounting of components and a reduction in the mounting surface area on the circuit board.

When the connecting points between the coils provided for each of the signal wires are commonly connected together in an ungrounded state via the noise dispersing capacitor, a high attenuation can be attained as compared with the case where no noise dispersing capacitor is provided, and further, the noise filter array obtained has a sharp cut off characteristic, thereby making it possible to suppress the influence exerted on the signal waveform. Further, since it is not necessary to form the grounding electrode pattern on the circuit board, it is possible to enhance the freedom of wiring layout on the circuit board, and to obviate the need to provide a large-area grounding electrode pattern in the inner portion of the circuit board. It thus becomes possible to achieve a reduction in the cost of the circuit board.

It is known that capacitive coupling between a plurality of signal wires causes problems such as cross talk. Further, it is known that generally, the signal frequency is not higher than several tens MHz and the noise frequency is within the GHz band. It is thus important to set the value of the noise dispersing capacitor (particularly, to use a capacitor having a small capacitance value) such that the influence of cross talk does not appear in the waveform. By setting the value of the noise dispersing capacitor to an appropriate value, it is possible to disperse only noise current to another signal wire.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Now, characteristic features of the present invention will be described in detail with reference to preferred embodiments thereof.

First Preferred Embodiment

Figure 1:
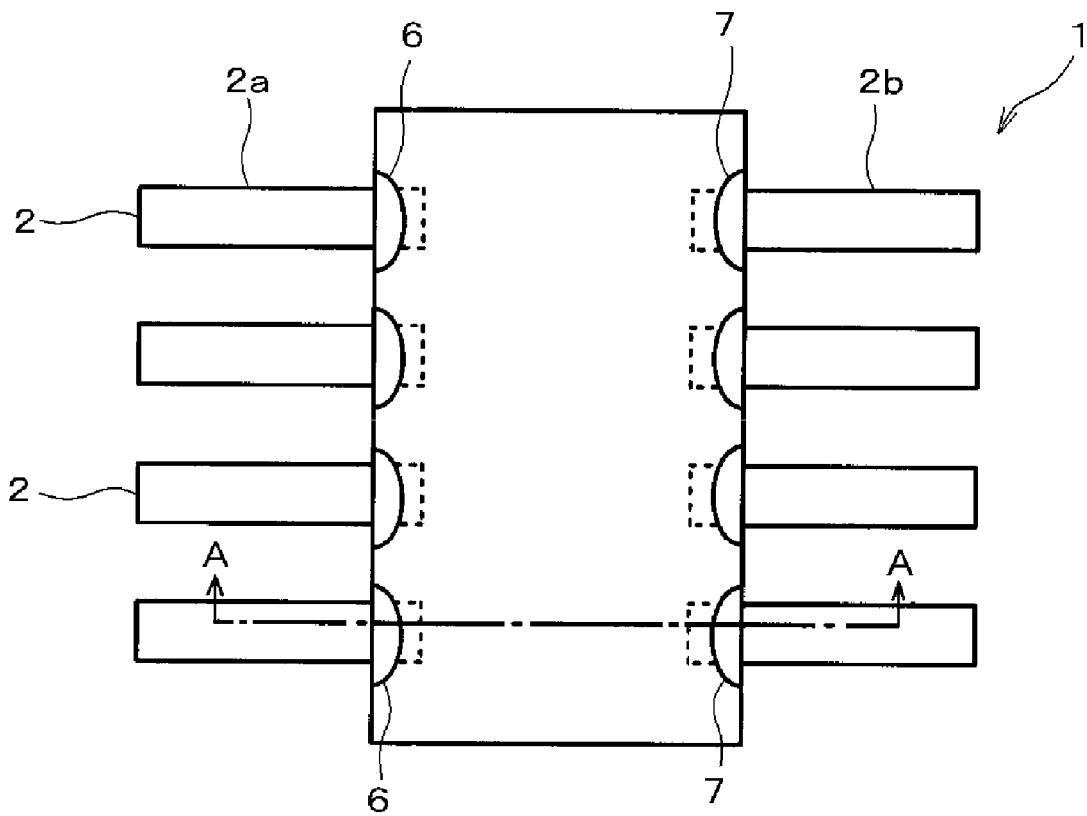
FIG. 1 is a plan view of a noise filter array according to a first preferred embodiment of the present invention as mounted on a circuit board.
Figure 2:
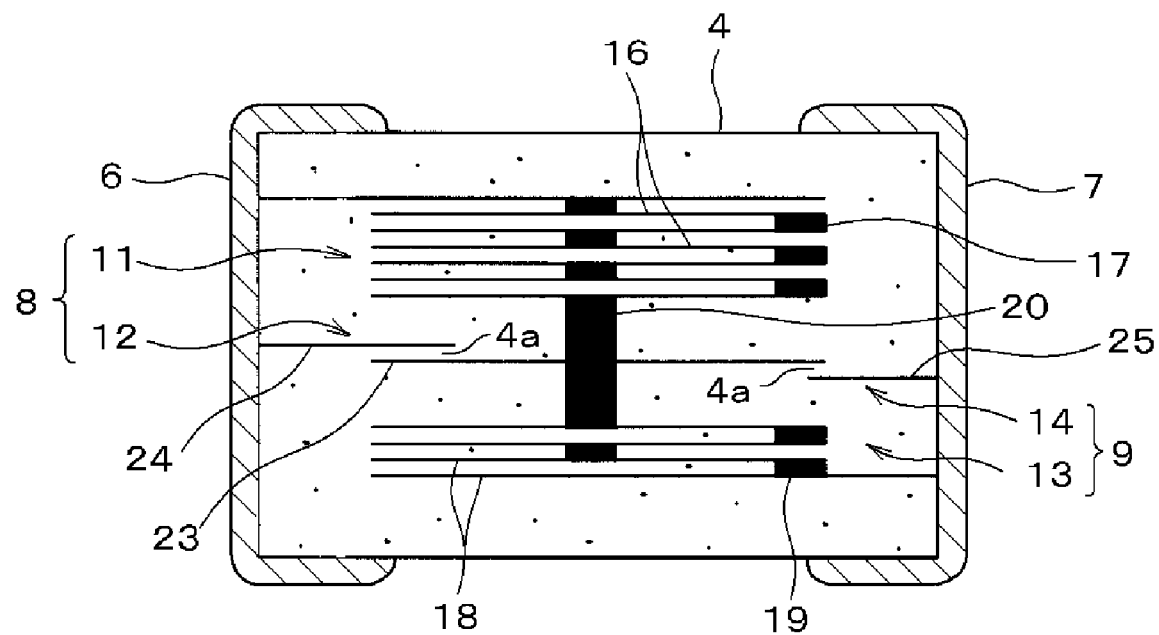
FIG. 2 is a sectional view taken along the line A-A of FIG. 1.
Figure 3:
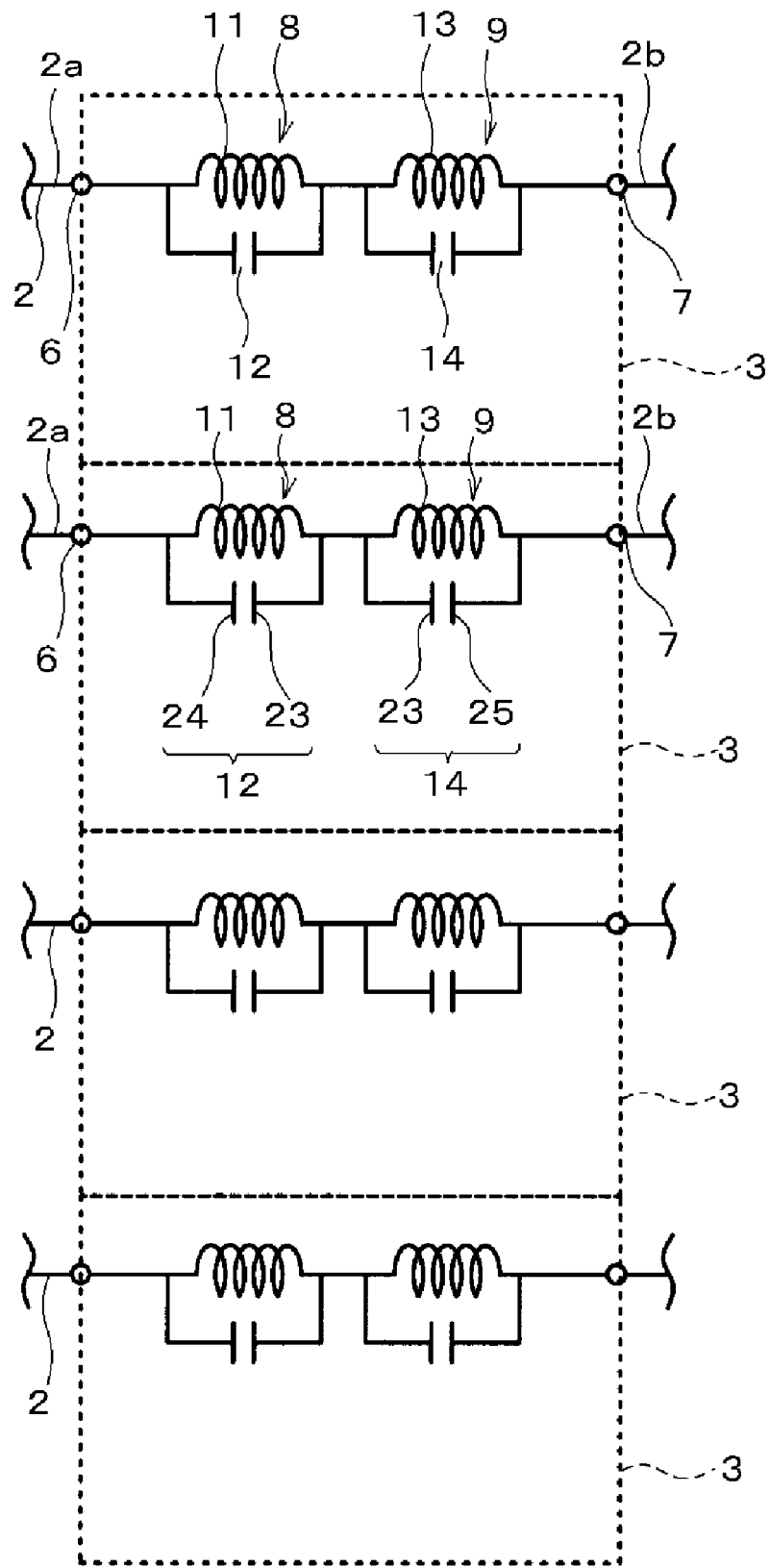
FIG. 3 is an equivalent circuit diagram of the noise filter array according to a preferred embodiment of the present invention.
Figure 4:
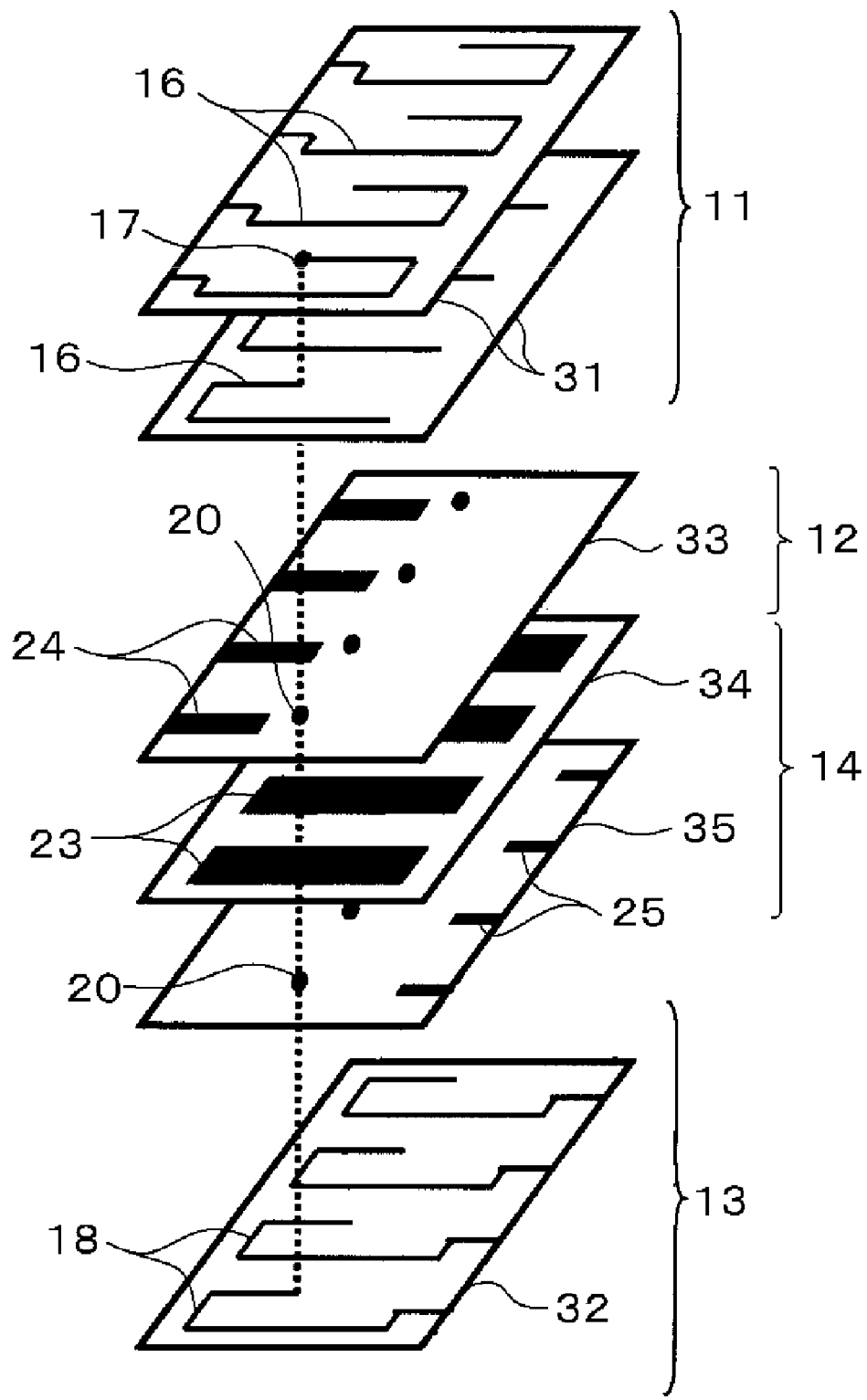
FIG. 4 is an exploded perspective view showing a method of manufacturing the noise filter array according to a preferred embodiment of the present invention.

FIG. 1 is a plan view showing a noise filter array according to a first preferred embodiment of the present invention as mounted on a circuit board, FIG. 2 is a sectional view taken along the line A-A of FIG. 1, FIG. 3 is an equivalent circuit diagram of the noise filter array according to the first preferred embodiment of the present invention, and FIG. 4 is an exploded perspective view showing a method of manufacturing the noise filter array according to the first preferred embodiment 1 of the present invention.

As shown in FIGS. 1 to 3, the noise filter according to first preferred embodiment serves to remove noise flowing in a plurality of (in the present preferred embodiment, four) signal wires 2 located on a circuit board 1. Four noise filters 3 are each preferably integral with a respective one of the signal wires 2.

That is, this noise filter array includes a substantially rectangular insulator 4 formed by laminating and then integrally firing insulating sheets such as ceramic green sheets. Further, on both end sides (outer left and right portions) of the insulator 4, external electrodes 6, 7 for signal input/output are formed individually in correspondence with the respective signal wires 2. The external electrodes 6, 7 are electrically connected by soldering or the like to left and right electrode patterns 2a, 2b constituting the respective signal wires 2, respectively.

Further, inside the insulator 4, two upstream and downstream LC parallel resonant circuits 8, 9 are arranged so as to be connected in tandem in correspondence with the respective signal wires 2. The two LC parallel resonant circuits 8, 9 constitute the noise filter 3 with respect to each of the signal wires 2.

As will be described later, the respective resonance frequencies of the LC parallel resonant circuits 8, 9 are preferably different from each other so that noise can be effectively removed in each of a plurality of frequency bands.

Here, the upstream LC parallel resonant circuit 8 includes an input-side coil 11 and an input-side capacitor 12 connected in parallel with the input-side coil 11, and the downstream LC parallel resonant circuit 9 includes an output-side coil 13 and an output-side capacitor 14 connected in parallel with the output-side coil 13. In the present preferred embodiment, the input-side coil 11 on the upper side and the output coil 13 on the lower side will hereinafter be also referred to as the "upstream and downstream coils 11, 13". The upstream and downstream coils 11, 13 correspond to the "upstream and downstream coils" recited in the claims.

The input-side coil 11 is preferably formed as a spiral coil by sequentially connecting together a plurality of coil conductors 16, which are laminated inside the insulator 4, through a via hole 17. Likewise, the output-side coil 13 is preferably formed as a spiral coil by sequentially connecting together a plurality of coil conductors 18, which are laminated inside the insulator 4, through a via hole 19. In this preferred embodiment, the number of turns is set to be different between the input-side coil 11 and the output-side coil 13 so that the resonance points of the respective LC parallel resonant circuits 8, 9 are different from each other.

Further, first ends of the input-side coil 11 and output coil 13 are connected to each other in series through a via hole 20, and second ends of the input coil 11 and output coil 13 are connected to the external electrodes 6, 7 on the input side and the output side, respectively.

Further, a shield electrode 23 is arranged between the upstream and downstream coils (the input coil 11 and the output coil 13) so as to be substantially perpendicular to the coil axis direction. Two upper and lower capacitance-forming electrodes 24, 25 are arranged so as to be opposed to the shield electrode 23 through the insulator 4. The shield electrode 23 and the upper capacitance-forming electrode 24 constitute the input-side capacitor 12, and the shield electrode 23 and the lower capacitance-forming electrode 25 constitute the output-side capacitor 14.

Further, the shield electrode 23 is electrically connected to the via hole 20 that provides serial connection between the input-side coil 11 on the upper side and the output-side coil 13 on the lower side, and is embedded in the insulator 4 so as to allow no external connection. Further, the shield electrode 23 preferably has a surface area that is large enough to cover the bore of the upstream and downstream coils 11, 13.

That is, the shield electrode 23 can function as one electrode for forming the capacitance of each of the capacitors 12, 14 as well as an electromagnetic shield for preventing electromagnetic coupling between the upstream and downstream coils 11, 13.

From the viewpoint of preventing the electromagnetic coupling between the upstream and downstream coils 11, 13, it is preferable that the surface area of the shield electrode 23 is equal to or larger than about ½ of the surface area of the bore of at least one of the upstream and downstream coils 11, 13.

Further, first end portions of the respective capacitance-forming electrodes 24, 25 are led out to the outer side portions of the insulator 4 to be electrically connected to the external electrodes 6, 7, respectively. Further, by previously adjusting the surface area or the distance over which the shield electrode 23 and each of the upper and lower capacitance-forming electrodes 24, 25 are opposed to each other in order to thereby vary the capacitances of the input-side capacitor 12 and output-side capacitor 14, the resonance points of the respective LC parallel resonant circuits 8, 9 are adjusted so that a noise having a frequency to be removed can be removed in a satisfactory manner. The resonance points can be also adjusted by adjusting the inductance of each of the individual coils 11, 13.

Next, a method of manufacturing the noise filter array according to the first preferred embodiment of the present invention will be described.

To manufacture the noise filter array according to the first preferred embodiment, as shown in, for example, FIG. 4, a predetermined number of input-side-coil-forming insulating sheets 31, output-side-coil-forming insulating sheets 32, capacitor-forming insulating sheets 33, 34, 35, and interconnection insulating sheets (not shown), which are interposed between the respective insulating sheets 31, 32, 33 to 35 as required, are prepared. A ceramic green sheet such as a dielectric or the like is preferably used as each of these insulating sheets.

Further, four coil conductors 16, 18 are formed in the coil-forming insulating sheets 31, 32 in order to form the coils 11, 13 in correspondence with the four signal wires 2, respectively. Further, the shapes of the respective coil conductors 16, 18 are preferably different between the insulating sheets 31, 32 so that they are formed in a spiral configuration with respect to the laminating direction of the insulating sheets 31, 32, respectively. Further, the directions of turns of the respective coil conductors 16, 18 are the same with respect to the direction in which signals flow.

On the other hand, of the capacitor-forming insulating sheets 33, 34, 35, the capacitance-forming electrodes 24, 25 are formed in the upper and lower insulating sheets 33, 35, respectively, and the shield electrode 23 is formed in the intermediate insulating sheet 34. A total of four shield electrodes 23 and four capacitance-forming electrodes 24, 25 are formed in parallel respectively in correspondence with the four signal wires 2. Further, of the insulating sheets 31 to 35, the via hole 20 or the like is formed in predetermined insulating sheets so as to provide electrical connection between the upper and lower sheets.

A material such as Ag—Pd or Ag is preferably used for each of the coil conductors 16, 18, the shield electrode 23, and the capacitance-forming electrodes 24, 25.

After laminating predetermined numbers of the output-side-coil-forming insulating sheets 32, capacitor-forming insulating sheets 33 to 35, and input-side-coil-forming insulating sheets 31, and, as required, interposing the interconnection insulating sheets (not shown) between the respective insulating sheets 31 to 35, the laminate of these insulating sheets is integrally fired. Thereafter, on both side portions (outer left and right portions) of the insulator 4 thus obtained, the external electrodes 6, 7 are formed in correspondence with the respective signal wires 2.

Thus, the noise filter array according to the first preferred embodiment having the construction shown in FIG. 2 and the equivalent circuit shown in FIG. 3 is obtained. In the noise filter array according to the first preferred embodiment, the respective coil conductors 16, 18 are sequentially connected together through the via holes 17, 19, 20 to thereby form the spiral input-side coil 11 and the output-side coil 13, respectively. Further, the one end sides of the respective coils 11, 13 are connected to the external electrodes 6, 7, and the other end sides thereof are connected to each other in series through the via hole 20 and are also commonly connected to the shield electrode 23. Further, the capacitance-forming electrodes 24, 25 are opposed to the shield electrode 23 through the insulator 4 (insulator layer 4a), and first ends of the respective capacitance-forming electrodes 24, 25 are connected to the external electrodes 6, 7, thereby forming the input-side capacitor 12 and the output-side capacitor 14, respectively. Accordingly, a construction is realized in which the input-side capacitor 12 and the output-side capacitor 14 are connected in parallel to the input-side coil 11 and the output-side coil 13, respectively.

When using the noise filter array according to the first preferred embodiment, in order to enable effective removal of noise in each of a plurality of frequency bands, the resonance point of each of the upstream and downstream LC parallel resonant circuits 8, 9 is preciously set to a resonance frequency at which noise included in each frequency band is to be removed, whereby noise in two communication bands in the vicinity of 800 MHz and in the vicinity of 2 GHz, which are required as noise countermeasures for potable telephones, for example, can be effectively removed.

Further, since the shield electrode 23 is interposed between the input-side coil 11 and the output-side coil 13, magnetic coupling between the upstream and downstream coils 11, 13 can be reliably cut off. Accordingly, the resonance frequencies of the respective LC parallel resonant circuits 8, 9 do not vary, and the trap attenuation in each of the plurality of frequency bands can be made large. For example, a high attenuation of about 20 dB or more can be secured for a resonance frequency on the high frequency side.

Further, in the noise filter array according to the first preferred embodiment, a plurality of noise filters 3 are integrally disposed within a single component and can together remove noises in the respective signal wires 2. Accordingly, it is not necessary to provide a noise filter individually for each signal wire 2, thereby making it possible to reduce the number of components. Further, since the plurality of LC parallel resonant circuits 8, 9 are disposed within the single insulator 4, it is possible to provide a highly reliable noise filter array that is free from structural flaws with relatively little fear of cracks or peels occurring during the manufacture thereof.

With respect to the noise filter array according to the first preferred embodiment of the present invention, the following evaluation experiment was carried out in order to examine the filter characteristics thereof.

Evaluation Experiment

Figure 5:
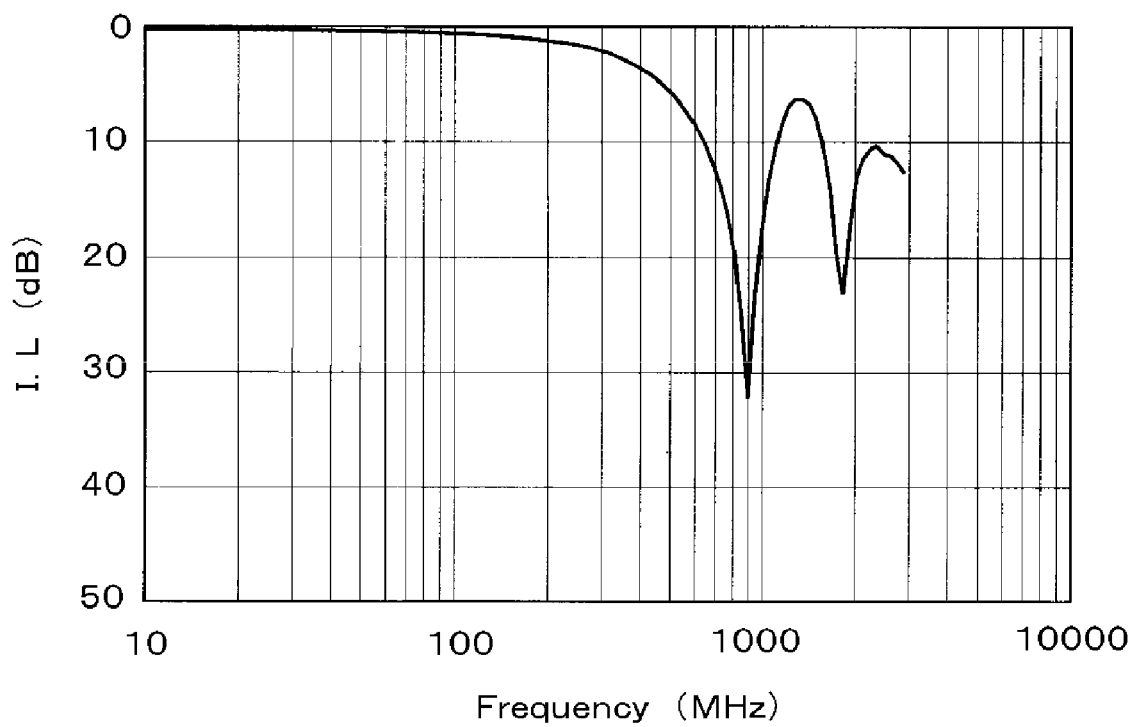
FIG. 5 is a characteristic chart showing the frequency-dependent characteristic of insertion loss in the noise filter array according to a preferred embodiment of the present invention.

With respect to one of the noise filters 3 constituting the noise filter array according to a preferred embodiment of the present invention, the frequency-dependent characteristic (hereinafter, referred to as the "IL characteristic") of the insertion loss (IL) thereof was examined. Here, the inductance L1 of the input-side coil 11 of the upstream LC parallel resonant circuit 8, the capacitance C1 of the input-side capacitor 12, the inductance L2 of the output-side coil 13 of the downstream LC parallel resonant circuit 9, and the capacitance C2 of the output-side capacitor 14 were set to approximately 24 nH, 1.2 pF, 18 nH, and 0.4 pF, respectively. FIG. 5 shows the results.

As shown in FIG. 5, it was confirmed that the noise filter 3 has a resonance frequency in each of two communication bands in the vicinity of 800 Hz and in the vicinity of the 2 GHz, which are required as noise countermeasures for portable telephones, and thus can effectively remove noise included in each of the communication bands.

Second Preferred Embodiment

Figure 6:
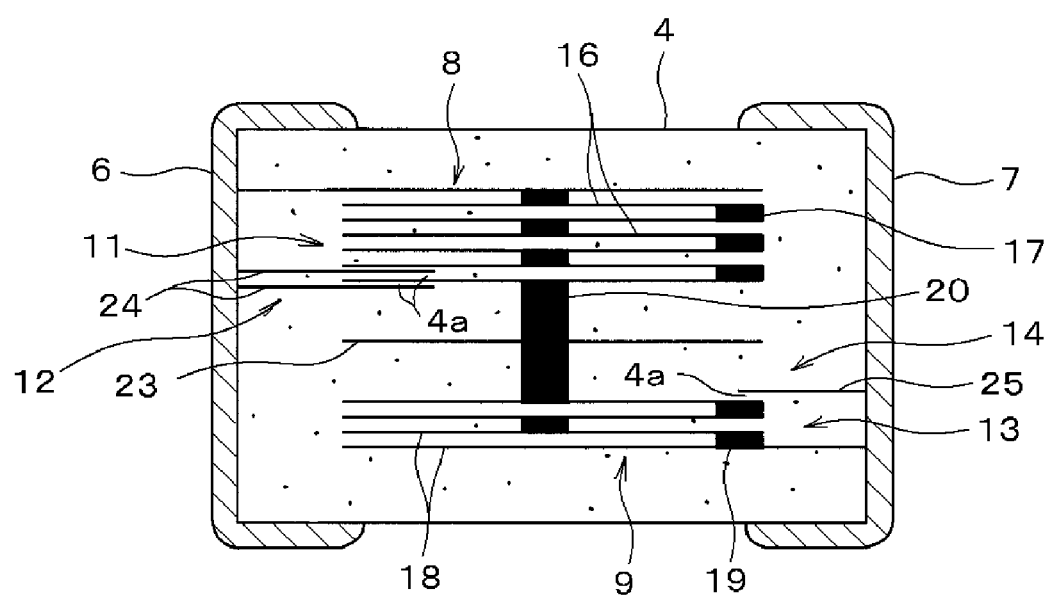
FIG. 6 is a sectional view showing the construction of a noise filter array according to another preferred embodiment of the present invention.

FIG. 6 is a sectional view of a noise filter array according to a second preferred embodiment of the present invention. In FIG. 6, the portions that are denoted by the same reference numerals as those of FIGS. 1 to 4 indicate portions that are the same as or equivalent to those of the noise filter array according to the first preferred embodiment.

The noise filter array according to the second preferred embodiment preferably has the same equivalent circuit as that shown in FIG. 3.

Note that, however, that in the noise filter array according to second preferred embodiment, the input-side capacitor 12 and the output-side capacitor 13 are formed preferably by arranging the capacitance-forming electrodes 24, 25 so as to be opposed to a portion of the coil conductors 16, 18 forming the input-side coil 11 and the output-side coil 13 through the insulator 4 (insulator layers 4a), respectively.

That is, the input-side capacitor 12 is formed preferably by arranging the capacitance-forming electrodes 24 so as to be opposed to a portion of the coil conductors 16 on the output side forming the input-side coil 11 through the insulator 4 (insulator layer 4a), and the output-side capacitor 14 is formed preferably by arranging the capacitance-forming electrode 25 so as to be opposed to a portion of the coil conductors 18 on the input side forming the output-side coil 13 through the insulator 4 (insulator layer 4a). Further, first ends of the respective capacitance-forming electrodes 24, 25 are led out to the both outer side portions of the insulator 4 to be electrically connected to the external electrodes 6, 7, respectively. Thus, two LC parallel resonant circuits 8, 9 are provided, in which the input-side capacitor 12 and the output-side capacitor 14 are connected in parallel to the input-side coil 11 and the output-side coil 13, respectively.

Further, by adjusting the surface area or the distance over which the capacitance-forming electrodes 24, 25 are opposed to the respective coil conductors 16, 18 to thereby vary the capacitances of the input-side capacitor 12 and output-side capacitor 14, the resonance points of the respective LC parallel resonant circuits 8, 9 are adjusted to resonance frequencies at which noise is to be removed. The resonance points can be also adjusted by adjusting the inductance of each of the input-side coils 11 and output-side coil 13.

Further, in the second preferred embodiment, as in the case of the first preferred embodiment, the shield electrode 23 is preferably provided between the input-side coil 11 on the upper side and the output-side coil 13 on the lower side, and is electrically connected to the via hole 20 that provides serial connection between the input-side coil 11 on the upper side and the output-side coil 13 on the lower side.

When, as described above, the shield electrode 23 is provided between the input-side coil 11 on the upper side and the output-side coil 13 on the lower side, electromagnetic coupling between the upper and lower coils 11, 13 is prevented even in cases where the component size is small and the coils 11, 13 are in close proximity to each other, thereby making it possible to secure high attenuation. However, depending on the component size, there may be cases where a sufficient distance can be secured between the upper and lower coils 11, 13. In such cases, it is possible to omit the shield electrode 23 because the magnetic coupling between the upper and lower coils 11, 13 becomes extremely small.

Further, while in the second preferred embodiment, the shield electrode 23 is electrically connected to the via hole 20 that provides electrical connection between the upper and lower coils 11, 13, in preventing the magnetic coupling between the upper and lower coils 11, 13, the shield electrode 23 may be electrically separated from the via hole 20.

Otherwise, the construction and effects of the second preferred embodiment are the same as those of the first preferred embodiment, so detailed description is omitted here to avoid repetition.

Third Preferred Embodiment

Figure 7:
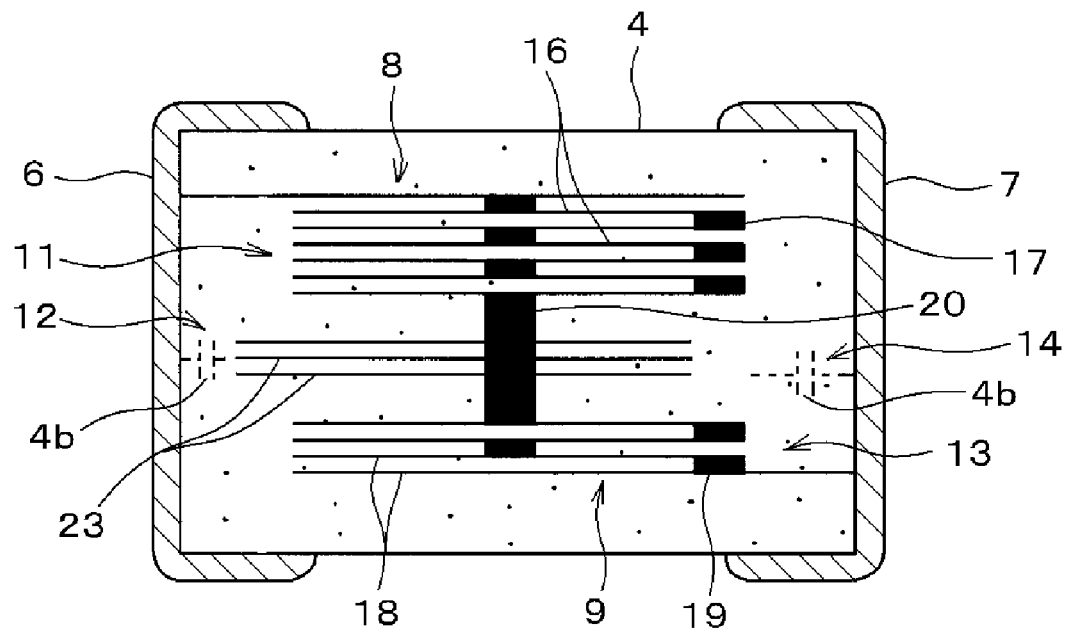
FIG. 7 is a sectional view showing the construction of a noise filter array according to a further preferred embodiment of the present invention.

FIG. 7 is a sectional view of a noise filter array according to third preferred embodiment of the present invention. In FIG. 7, the portions that are denoted by the same reference numerals as those of FIGS. 1 to 4 indicate portions that are the same as or equivalent to those of the noise filter array according to the first preferred embodiment.

The noise filter array according to third preferred embodiment has the same equivalent circuit as that shown in FIG. 3.

However, in the noise filter array according to third preferred embodiment, the input-side capacitor 12 and the output-side capacitor 14 preferably include external electrodes 6, 7 for signal input/output, which are respectively formed on both end sides (outer left and right portions) of the insulator 4 in correspondence with the respective signal wires 2, and the shield electrodes 23 that are commonly connected to the upstream and downstream coils 11, 13 through the via hole 20.

That is, the input-side capacitor 12 preferably includes the input-side external electrode 6, and the shield electrode 23 opposed to the input-side external electrode 6 through the insulator 4 (4b). Further, the output-side capacitor 14 preferably includes the output-side external electrode 7, and the shield electrode 23 opposed to the output-side external electrode 7 through the insulator 4 (4b). The respective coils 11, 13 are thus connected in parallel to the capacitors 12, 14, thereby defining the respective LC parallel resonant circuits 8, 9.

Further, in the noise filter array according to the third preferred embodiment, by adjusting the distance over which each of the external electrodes 6, 7 and the shield electrode 23 are opposed to each other to thereby vary the capacitances of the input-side capacitor 12 and output-side capacitor 14, the resonance points of the respective LC parallel resonant circuits 8, 9 are adjusted to resonance frequencies at which noise is to be removed. The resonance points can be also adjusted by adjusting the inductance of each of the input-side coils 11 and output-side coil 13.

Otherwise, the construction and effects of third preferred embodiment are the same as those of first preferred embodiment, so detailed description is omitted here.

Fourth Preferred Embodiment

Figure 8:
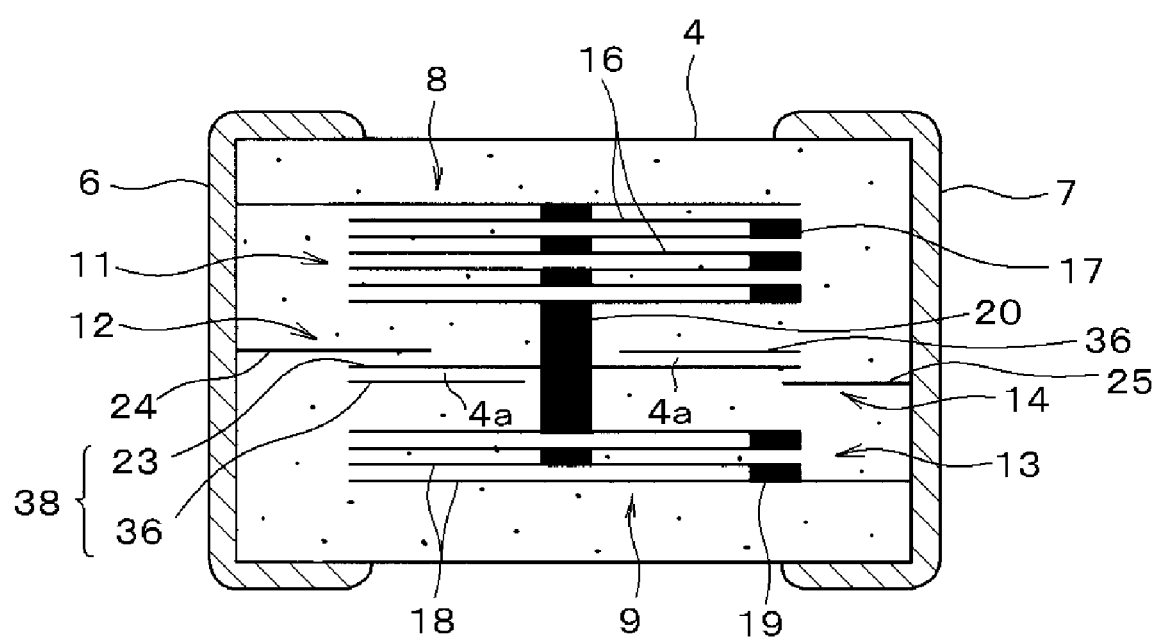
FIG. 8 is a sectional view showing the construction of a noise filter array according to a preferred embodiment of the present invention.
Figure 9:
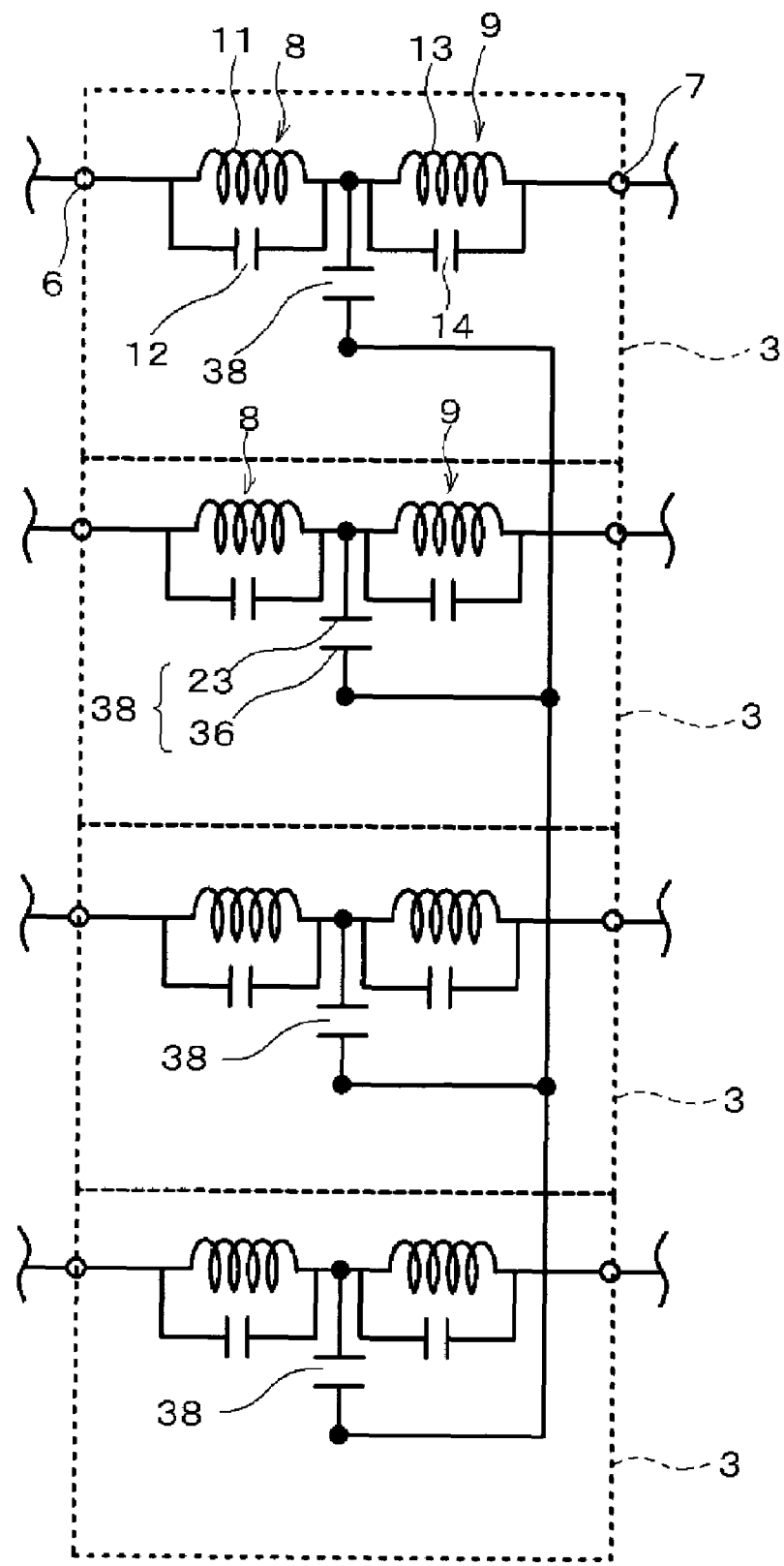
FIG. 9 is an equivalent circuit diagram of the noise filter array according to a preferred embodiment of the present invention.
Figure 10:
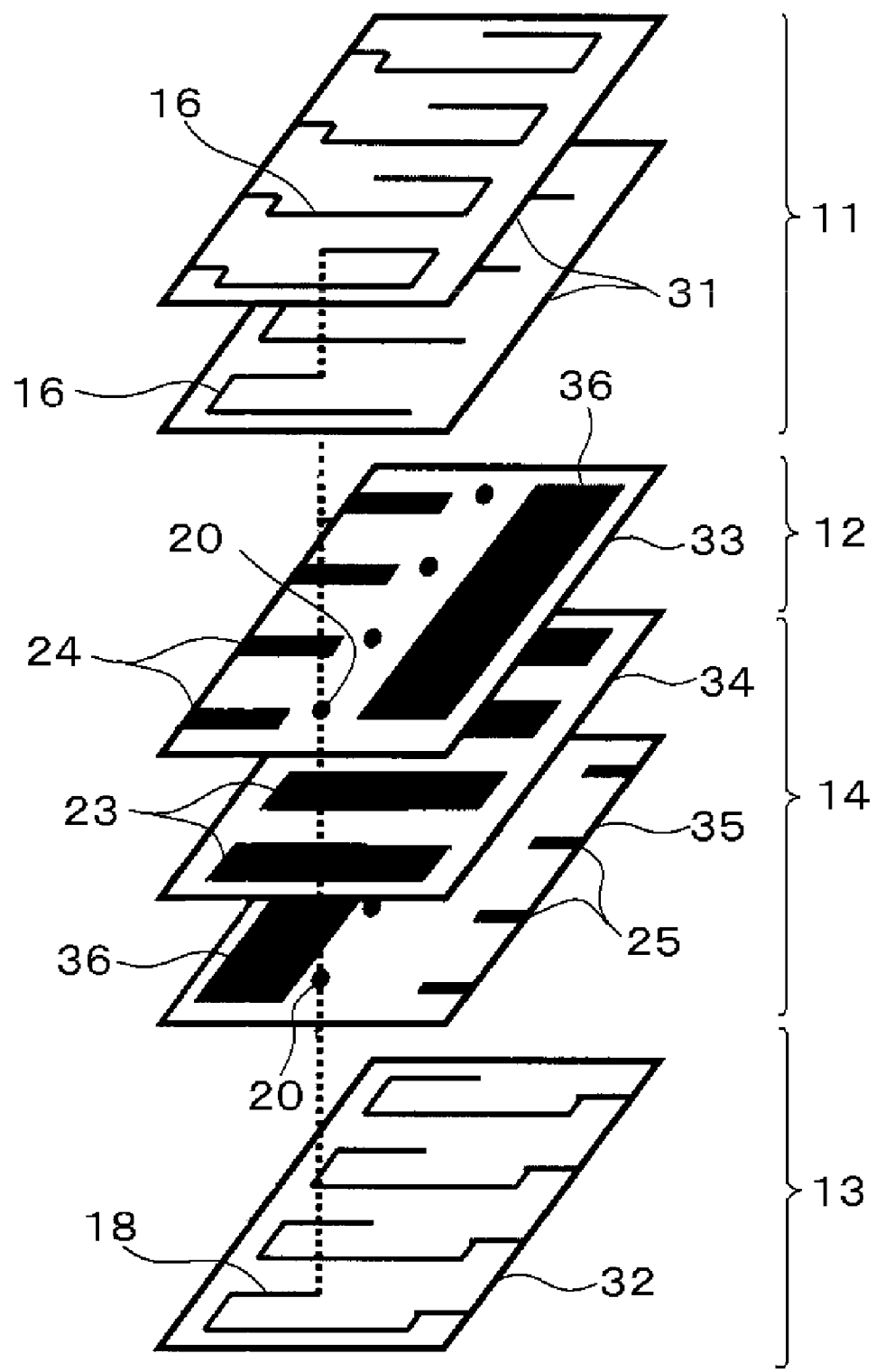
FIG. 10 is an exploded perspective view showing a method of manufacturing the noise filter array according to a preferred embodiment of the present invention.

FIG. 8 is a sectional view of a noise filter array according to the fourth preferred embodiment of the present invention, FIG. 9 is an equivalent circuit diagram thereof, and FIG. 10 is an exploded perspective view showing a manufacturing method thereof.

In FIGS. 8 to 10, the portions that are denoted by the same reference numerals as those of FIGS. 1 to 4 indicate portions that are the same as or equivalent to those of the noise filter array according to first preferred embodiment.

The noise filter array according to the fourth preferred embodiment has, in addition to the construction according to the first preferred embodiment described with reference to FIGS. 1 to 4, a construction in which the connecting points between the respective coils 11, 13 of the upstream and downstream LC parallel resonant circuits 8, 9, which constitute the noise filter 3 provided for each signal wire 2, are commonly connected together in an ungrounded state via noise dispersing capacitors 38.

That is, in the noise filter array, the input-side capacitor 12 and the output-side capacitor 14 are preferably formed by arranging the capacitance-forming electrodes 24, 25 so as to be opposed to the shield electrode 23 provided inside the insulator 4, respectively. Further, noise dispersing electrodes 36 are arranged above and below the shield electrode 23 so as to be opposed to the shield electrode 23 through the insulator 4 (insulator layers 4a). The noise dispersing capacitor 38 is preferably defined by the shield electrode 23 and each noise dispersing electrode 36.

Further, in the noise filter array according to fourth preferred embodiment, while the shield electrode 23 and the capacitance-forming electrodes 24, 25 are provided for respective signal wires 2 so as to extend along the signal wires 2, the upper and lower noise dispersing electrodes 36 are formed continuously along the direction that is substantially perpendicular to the respective signal wires 2 (the direction that is substantially perpendicular to the plane of FIG. 8) so as to cross the respective electrodes 23, 24, 25. Further, the noise dispersing electrodes 36 are embedded in the insulator 4 so as to allow no external connection. That is, in addition to defining one capacitance-forming electrode of each noise dispersing capacitor 38, each noise dispersing electrode 36 also defines the electrode for commonly connecting the noise dispersing capacitors 38 to each other in an ungrounded state.

Next, a method of manufacturing the noise filter array according to the fourth preferred embodiment will be described with reference to FIG. 10.

Although the manufacturing method for the noise filter array according to the fourth preferred embodiment is basically the same as that in the first preferred embodiment, since it is necessary to form the noise dispersing capacitors 38 simultaneously with the formation of the upstream and downstream LC parallel resonant circuits 8, 9 for each of the four signal wires 2, the noise dispersing electrode 36 is formed simultaneously in each of the insulating sheets 33, 35 in which the respective capacitance-forming electrodes 24, 25 are formed. Here, the respective noise dispersing electrodes 36 extend in a direction crossing the capacitance-forming electrodes 24, 25 (the direction along the longitudinal direction of the insulating sheets 33, 35).

Further, after laminating predetermined numbers of the output-side-coil-forming insulating sheets 32, capacitor-forming insulating sheets 33 to 35, and input-side-coil-forming insulating sheets 31, and, as required, interposing the interconnection insulating sheets (not shown) between the respective insulating sheets 31 to 35, the laminate of these insulating sheets is integrally fired. Thereafter, on both side portions (outer left and right portions) of the insulator 4 thus obtained, the external electrodes 6, 7 for signal input/output are formed in correspondence with the respective signal wires 2.

The noise filter array according to the fourth preferred embodiment is thus obtained, which has a construction in which, as shown in FIG. 8, the two upstream and downstream LC parallel resonant circuits 8, 9 are formed within the insulator 4 for each of the signal wires 2, and the connecting points between the respective coils 11, 13 of the LC parallel resonant circuits 8, 9 are commonly connected together in an ungrounded state via the noise dispersing capacitors 38, and which has the equivalent circuit as shown in FIG. 9.

In the noise filter array constructed as described above, a noise current flowing in one signal wire 2 is reduced due to the loss in the LC parallel resonant circuits 8, 9 of each signal wire 2, and further dispersed to another signal wire 2 via the noise dispersing capacitor 38. Therefore, when the above-described noise filter array is used, noise in each frequency band can be even more effectively removed than in the first preferred embodiment. Further, since the noise filter has a sharp cut off characteristic, the influence on the signal waveform can be suppressed to be small.

Further, the electrode pattern for grounding, which is required in the prior art, becomes unnecessary, whereby an improvement can be achieved in terms of the freedom of the wiring layout of the circuit board 1 (FIG. 1). Since it becomes possible to use a circuit board 1 having a simple construction, it is possible to achieve a reduction in cost.

Otherwise, the construction and effects of the fourth preferred embodiment are the same as those of the first preferred embodiment, so detailed description is omitted here to avoid repetition.

Figure 11:
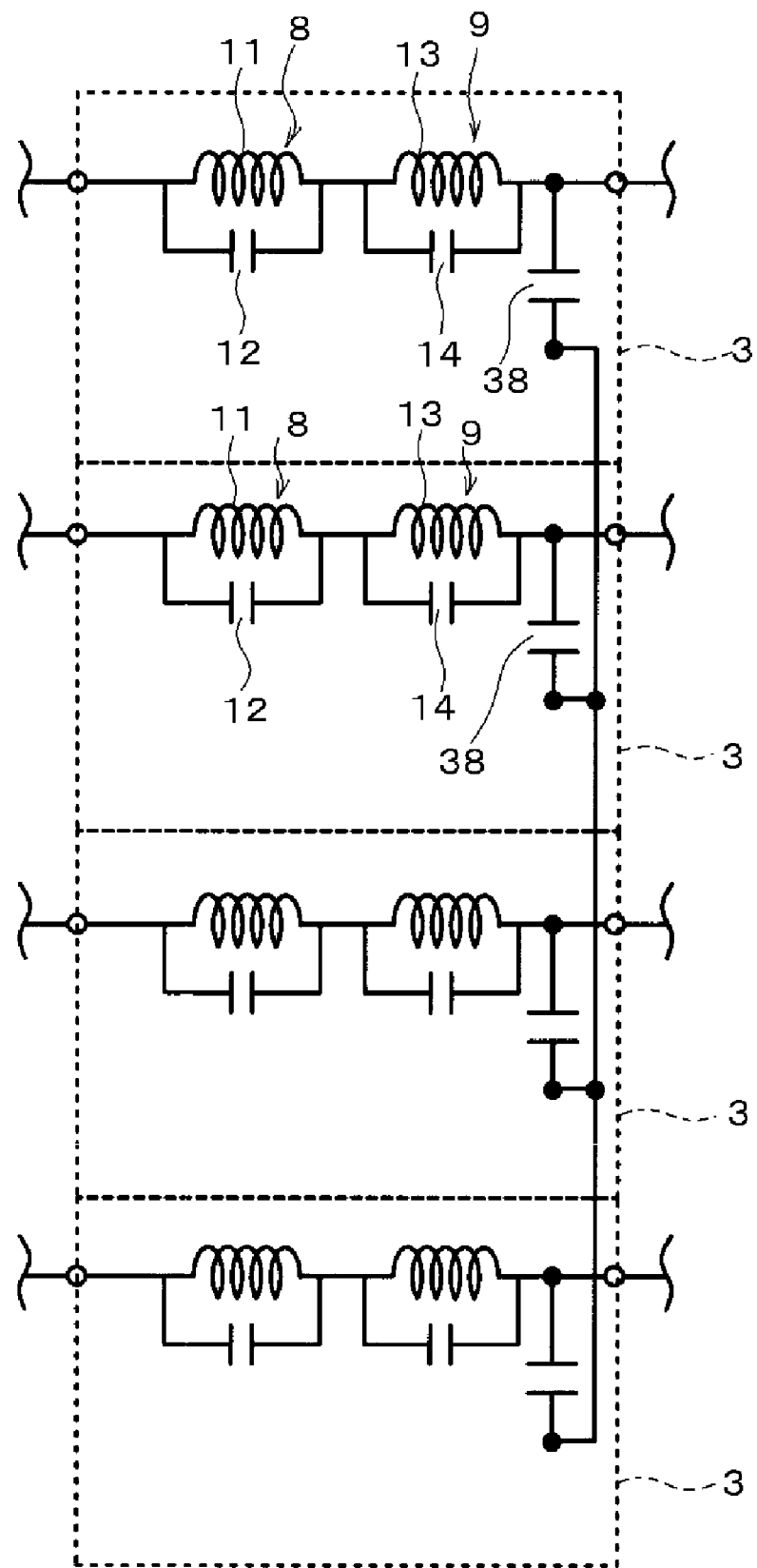
FIG. 11 is an equivalent circuit diagram showing a modification of the noise filter array according to a preferred embodiment of the present invention.

While in the fourth preferred embodiment described above, the connecting points between the respective coils 11, 13 of the upstream and downstream LC parallel resonant circuits 8, 9 are commonly connected together in an ungrounded state via the noise dispersing capacitor 38, the present invention is not limited to this construction. For example, as shown in FIG. 11, a construction is also possible in which the noise dispersing capacitors 38 are commonly connected together in an ungrounded state on the output sides of the downstream LC parallel resonant circuits 9. Alternatively, although not shown, a construction is also possible in which, conversely, the noise dispersing capacitors 38 are commonly connected together in an ungrounded state on the input sides of the upstream LC parallel resonant circuits 8.

With respect to the noise filter array according to the fourth preferred of the present invention, the following evaluation experiment was carried out in order to examine the filter characteristics thereof.

Evaluation Experiment 1

Figure 12:
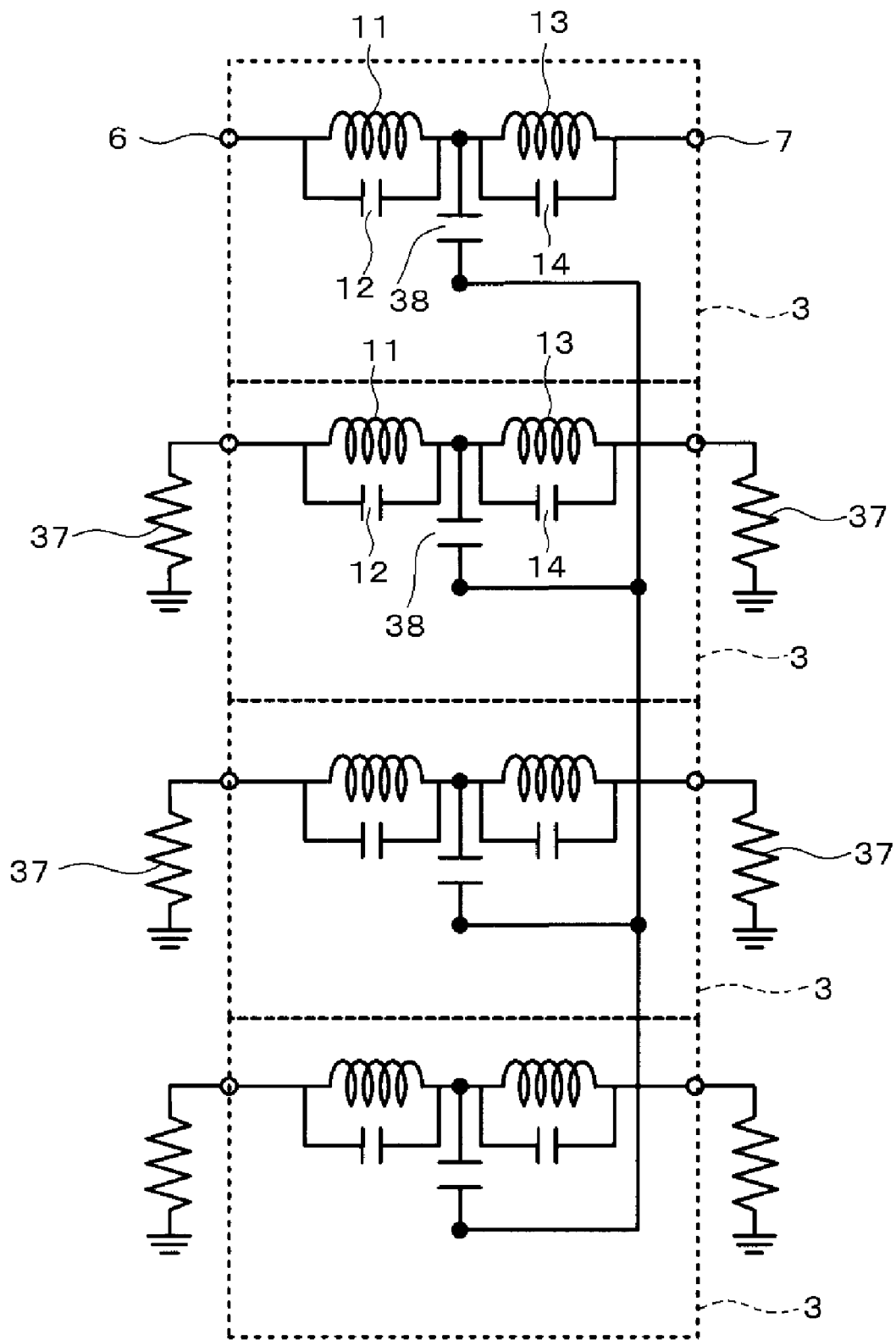
FIG. 12 is an equivalent circuit diagram showing the wiring state when an evaluation experiment is performed on the noise filter array according to a preferred embodiment of the present invention.
Figure 13:
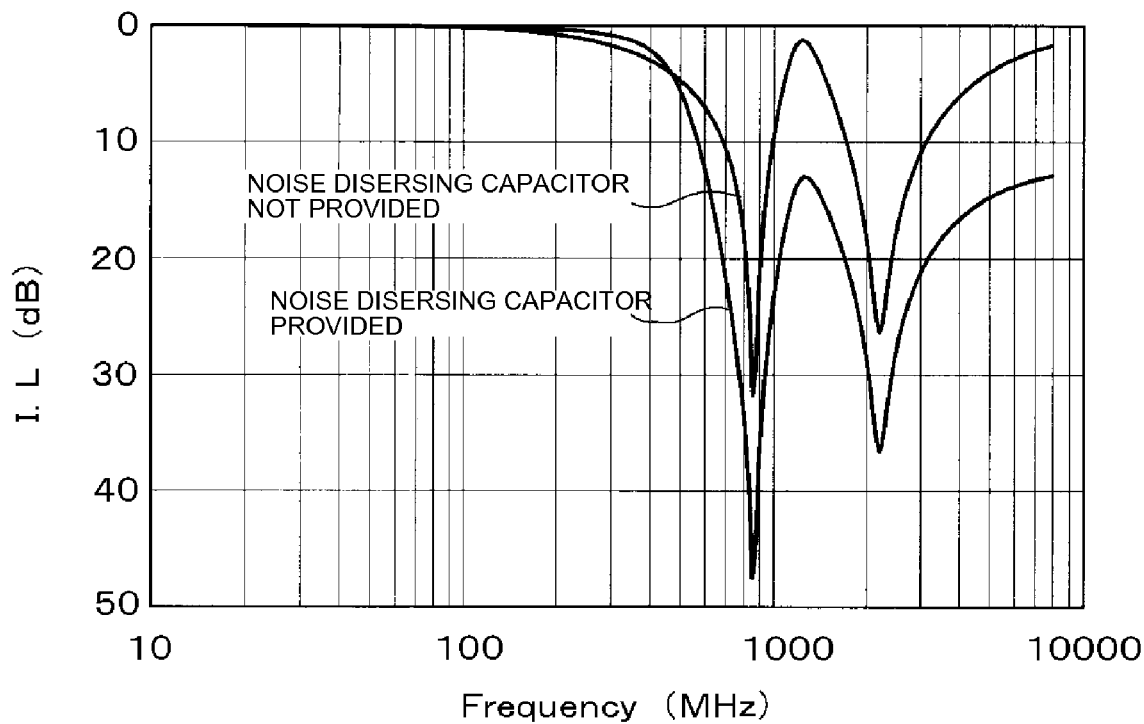
FIG. 13 is a characteristic chart showing the frequency-dependent characteristic of insertion loss in the noise filter array according to one preferred embodiment of the present invention as compared with the case of another preferred embodiment of the present invention.

The IL characteristic of the noise filter array having the construction according to the fourth preferred embodiment was examined. Here, in order to prevent a difference in IL characteristic from occurring due to the influence of cross talk, as in the equivalent circuit shown in FIG. 12, measurement was carried out by connecting terminal resistors 37 of 50Ω to the left and right ends of three of the four noise filters 3. For the purpose of comparison of characteristics, the IL characteristic was examined also with respect to the construction according to the first preferred embodiment with no noise dispersing capacitor 38 provided. Here, the measurement was carried out while uniformly setting the inductances of the input-side coils 11 of the upstream LC circuits 8 to about 20 nH, the capacitances of the input-side capacitors 12 to about 1.7 pF, the inductances of the output-side coils 13 of the downstream LC circuits 9 to about 13 nH, and the capacitances of the output-side capacitors 14 to about 0.4 pF. FIG. 13 shows the results.

As shown in FIG. 13, in the case where the noise dispersing capacitors 38 are provided, large signal attenuation was attained in the two communication bands in the vicinity of 800 MHz and in the vicinity of 2 GHz, which are required as noise countermeasures for portable telephones, and between the two bands. Thus, it was confirmed that noise included in each of the communication bands can be effectively removed.

Evaluation Experiment 2

Figure 14:
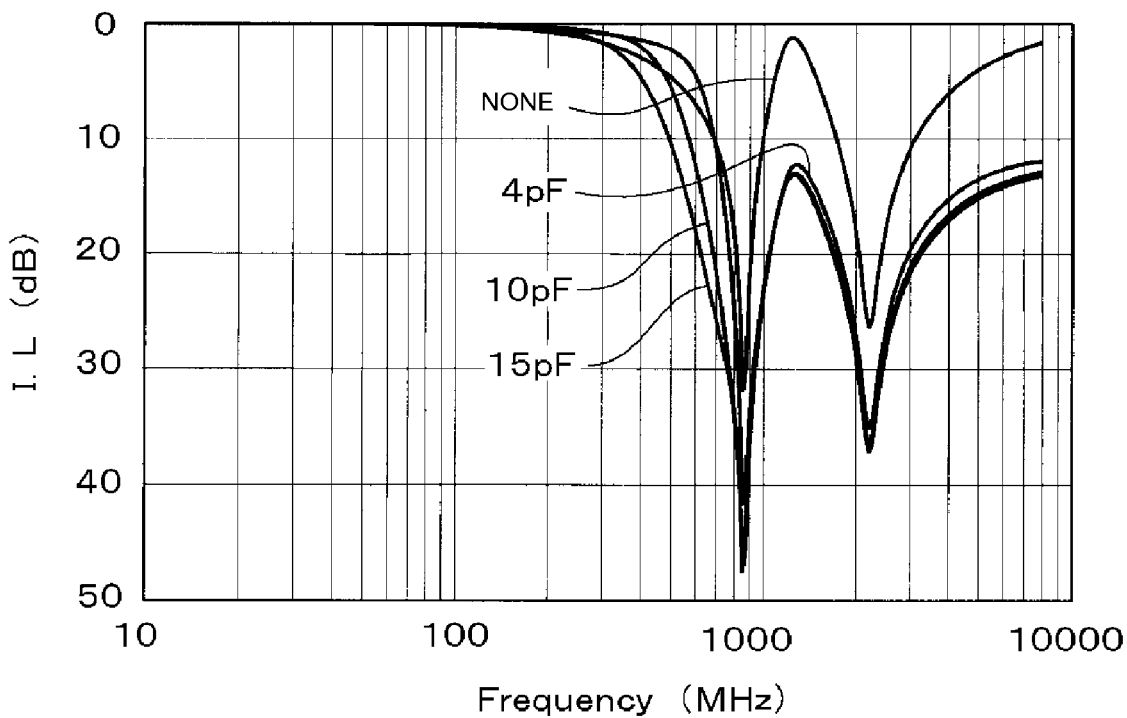
FIG. 14 is a characteristic chart showing the frequency-dependent characteristic of insertion loss when the capacitance of a noise dispersing capacitor is varied in the noise filter array according to a preferred embodiment of the present invention.

With respect to the noise filer array having the construction according to the fourth preferred embodiment, the IL characteristic in the case where the capacitance of the noise dispersing capacitor 38 is varied within the range of 0 pF to 15 pF was measured. In this case as well, the measurement was carried out by performing wiring connection so as to realize the equivalent circuit shown in FIG. 12. FIG. 14 shows the results.

As shown in FIG. 14, it was confirmed that the larger the capacitance of the noise dispersing capacitor 38 is, the larger the attained signal attenuation is. However, when the capacitance becomes too large, cross talk occurs in the signal frequency band, so the influence on the signal waveform becomes large. In view of this, it is considered appropriate to set the capacitance of the noise dispersing capacitor 38 to 4 pF through 10 pF.

Evaluation Experiment 3

Figure 15:
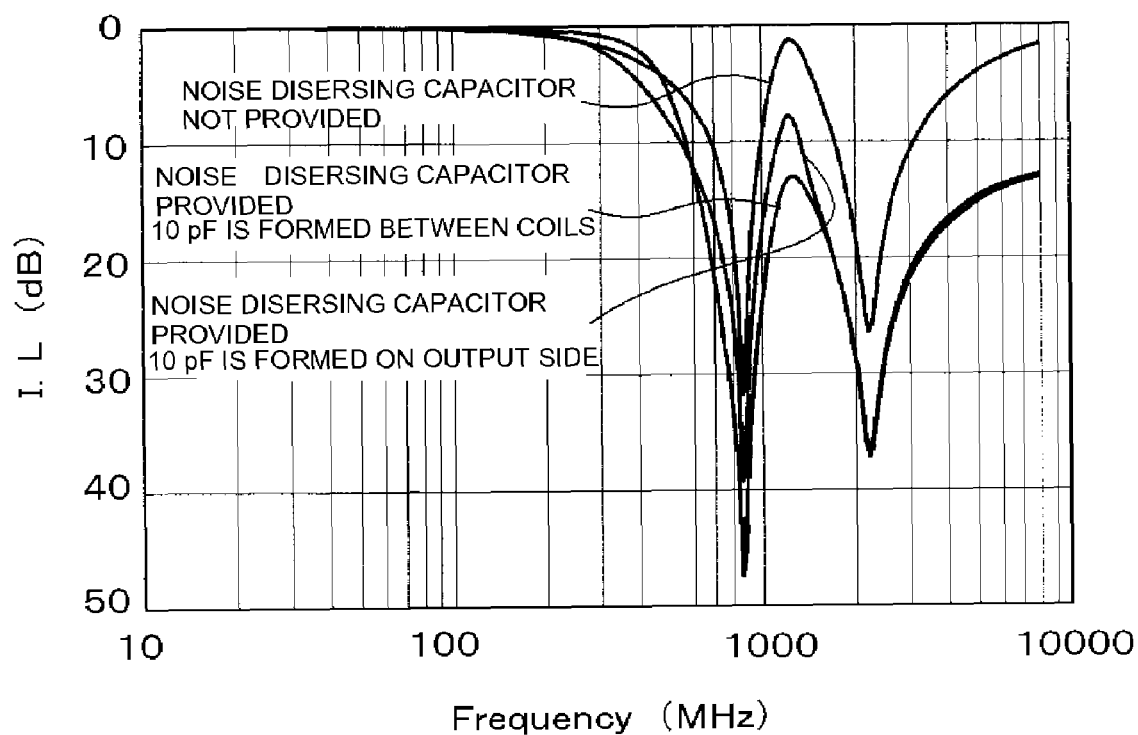
FIG. 15 is a characteristic chart showing the results of measurement of the frequency-dependent characteristic of insertion loss in the case of the construction shown in FIG. 9 and that in the case of the construction shown in FIG. 11, in the noise filter array according to a preferred embodiment of the present invention.

The IL characteristic was measured with respect to the case (FIG. 9) where the connecting points between the respective coils 11, 13 of the upstream and downstream LC parallel resonant circuits 8, 9 are commonly connected together in an ungrounded state via the noise dispersing capacitors 38, and the case (FIG. 11) where the noise dispersing capacitors 38 are commonly connected together in an ungrounded state on the output sides of the downstream LC parallel resonant circuits 9. The measurement conditions in this case were set to be the same as those for Evaluation Experiment 1. FIG. 15 shows the results. FIG. 15 also shows the IL characteristic in the case where no noise dispersing capacitor 38 is provided.

As shown in FIG. 15, in either cases of the construction shown in FIG. 9 and the construction shown in FIG. 11, in comparison to the case where no noise dispersing capacitor 38 is provided, a large signal attenuation was attained in each of the two communication bands in the vicinity of 800 MHz and in the vicinity of 2 GHz, which are required as noise countermeasures for portable telephones. Thus, it was confirmed that noise included in each communication band can be effectively removed.

Incidentally, in each of the first through fourth preferred embodiments described above, the plurality of LC parallel resonant circuits 8, 9 whose resonance frequencies are different from each other are formed by individually connecting the capacitors 12, 14 in parallel to the respective coils 11, 13, respectively. Accordingly, the inductances of the coils 11, 13 and the capacitances of the capacitors 12, 14 can be readily adjusted, whereby the resonance frequency of each of the LC parallel resonant circuits 8, 9 can be reliably set or controlled to a desired frequency required for the noise removal. Therefore, noise removal can be performed in a satisfactory manner for each of the frequency bands.

On the other hand, the above-described advantages can be also accomplished in a satisfactory manner by the constructions according to the fifth, sixth and seventh preferred embodiments described below.

That is, as described above, in an LC parallel resonant circuit, the resonance frequency is dependent on the value of the LC product. As the LC product becomes larger, the resonance frequency becomes smaller toward the low frequency side. Further, provided that the value of the LC product is the same, the larger the inductance L, the larger the attenuation becomes, and the larger the ratio of the capacitance C, the narrower the attenuation band becomes. Here, the setting of the resonance frequency on the high frequency side can be readily realized by adjusting the floating capacitance because the LC product may be small. Moreover, a wide attenuation band can be secured because a small floating capacitance suffices. On the other hand, for the setting of the resonance frequency on the low frequency side, the LC product must be set to be relatively large. In this case, since problems such as distortion of the signal waveform occur when the value of the inductance L is set too large, there is naturally a limit as to how large the value of the inductance L can be set. Further, when, in order to compensate for the limitations on the inductance L, the inter-layer distance between the coil conductors is reduced to set a large floating capacitance or the insulation material is changed, problems such as the loss of reliability due to degradation in characteristics or an increase in cost due to an increase in manufacturing man-hours occur.

In view of this, in the fifth to seventh preferred embodiments described below, with respect to noise on the low frequency side, an LC parallel resonant circuit capable of providing a somewhat large LC product is defined by the combination of a coil and a capacitor connected in parallel with the coil and, further, with respect to noise on the high frequency side, an LC parallel resonant circuit having a required LC product is defined by a coil and a floating capacitance generated between coil conductors (coil conductor layers) for forming the coil. Accordingly, a requisite noise removable action can be secured for each frequency band by means of a construction that is simpler than those of Embodiments 1 to 4. In the following, a more detailed description will be given in this regard by way of Embodiments 5 to 7.

Fifth Preferred Embodiment

Figure 16:
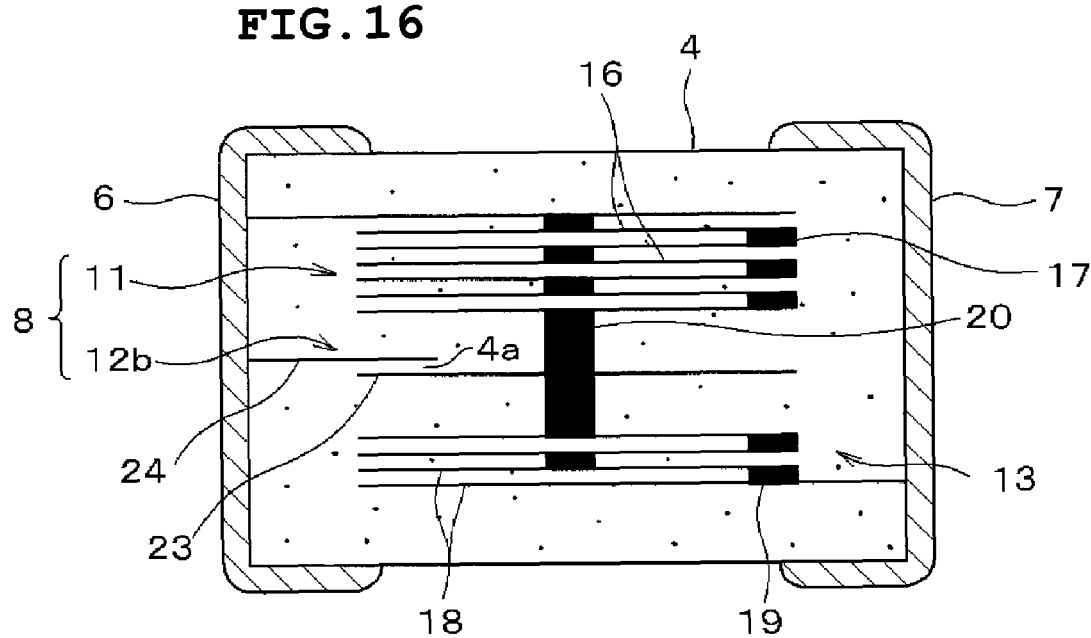
FIG. 16 is a sectional view showing the construction of a noise filter array according to a preferred embodiment of the present invention.
Figure 17:
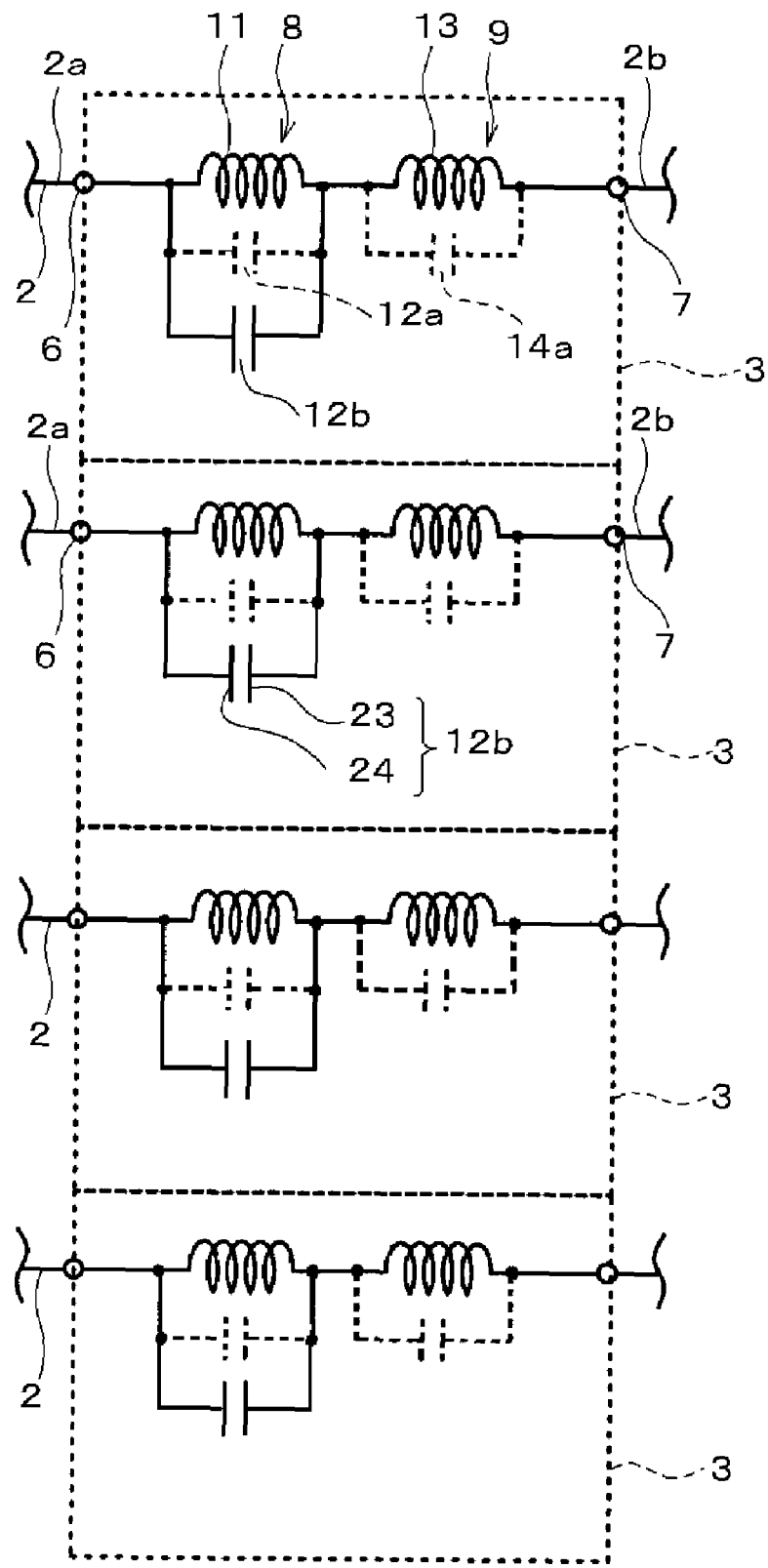
FIG. 17 is an equivalent circuit diagram of the noise filter array according to a preferred embodiment of the present invention.
Figure 18:
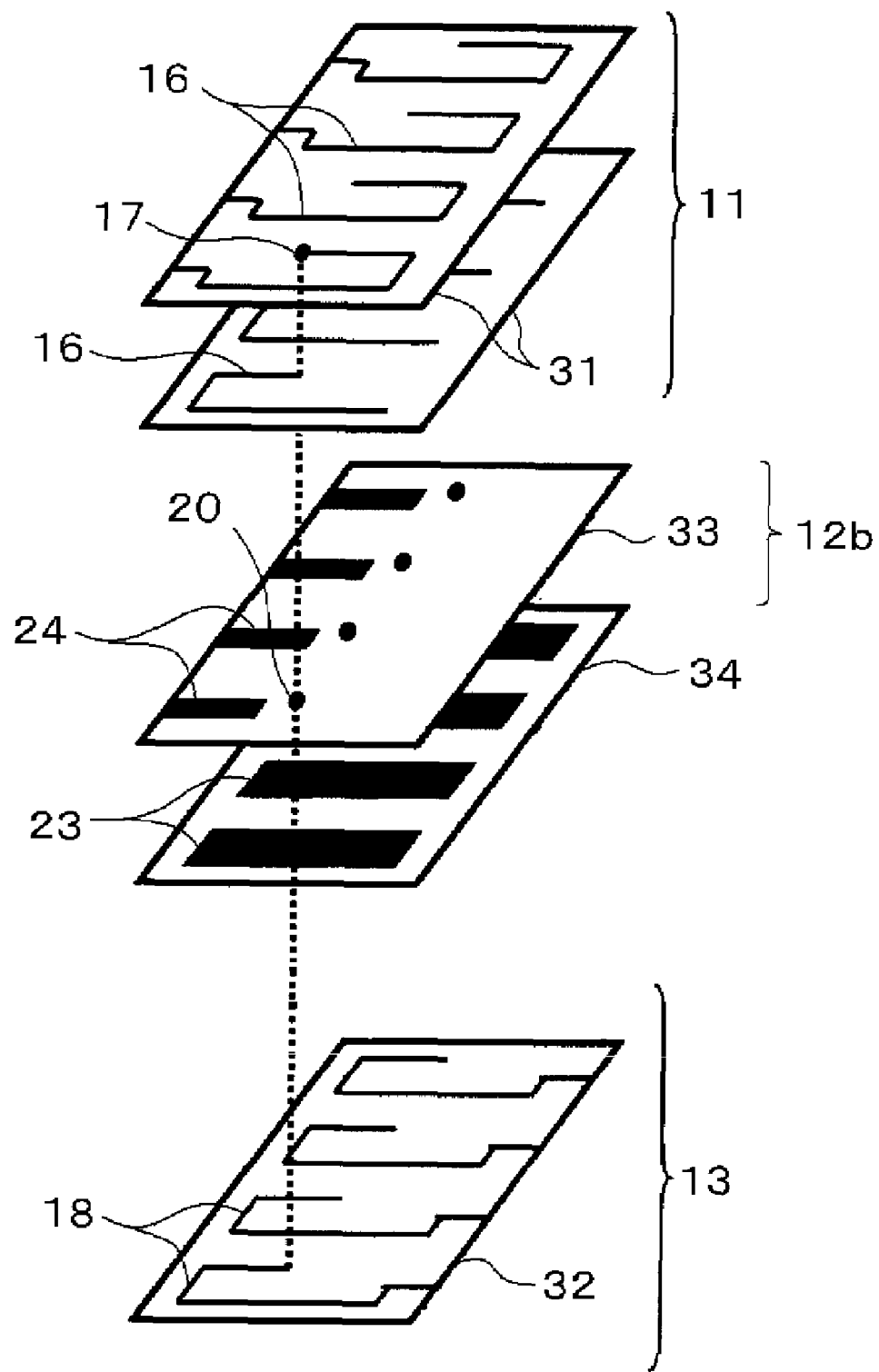
FIG. 18 is an exploded perspective view showing a method of manufacturing the noise filter array according to a preferred embodiment of the present invention.

FIG. 16 is a sectional view of a noise filter array according to the fifth preferred embodiment of the present invention, FIG. 17 is an equivalent circuit diagram of the noise filter array according to the fifth preferred embodiment of the present invention, and FIG. 18 is an exploded perspective view showing a manufacturing method of the noise filter array according to the fifth preferred embodiment of the present invention. In FIGS. 16 to 18, the portions that are denoted by the same reference numerals as those of FIGS. 1 to 4 indicate portions that are the same as or equivalent to those of the noise filter array according to first preferred embodiment.

In the noise filter array according to the fifth preferred embodiment, an input-side capacitor 12b is formed by arranging the capacitance-forming electrode 24 so as to be opposed to a portion of the shield electrode 23 via the insulator 4 (insulator layer 4a).

That is, the input-side capacitor 12b is formed by arranging the capacitance-forming electrode 24 so as to be opposed to a portion of the shield electrode 23, which is arranged between the upstream and downstream coils 11, 13 so as to be substantially perpendicular to the coil axis direction, through the insulator 4 (insulator layer 4a). Further, one end of the capacitance-forming electrode 24 is led out to one end side (outer left side portion) of the insulator 4 to be electrically connected to the external electrode 6. Accordingly, with respect to the input-side coil 11, a floating capacitor 12a (FIG. 17), which is naturally generated between the coil conductors (coil conductor layers) 16 as a result of the formation of the coil 11, and the input-side capacitor 12b generated by the capacitance-forming electrode 24 are both connected in parallel, thereby forming the LC parallel resonant circuit 8 on the low frequency side. Further, the LC parallel resonant circuit 9 on the high frequency side preferably includes the output-side coil 13, and a floating capacitor 14a (FIG. 17) naturally generated between the coil conductors (coil conductor layers) 18 as a result of the formation of the coil 13.

Further, in the noise filter array according to the fifth preferred embodiment, by adjusting the surface area or the distance over which the capacitance-forming electrode 24 is opposed to each of the coil conductors 16 to thereby vary the capacitance of the input-side capacitor 12b, the resonance point of the LC parallel resonant circuit 8 on the low frequency side is adjusted to a resonance frequency at which noise is to be removed. It is also possible to adjust the resonance points of the respective LC parallel resonant circuits 8, 9 by adjusting the inductances of the input-side coil 11 and output-side coil 13 or by adjusting the capacitances of the floating capacitors 12a, 14a.

Further, in the fifth preferred embodiment, the shield electrode 23 is provided between the input-side coil 11 on the upper side and the output-side coil 13 on the lower side, and is electrically connected to the via hole 20 that provides serial connection between the input-side coil 11 on the upper side and the output-side coil 13 on the lower side.

As described above, according to the fifth preferred embodiment, in each noise filter 3, the LC parallel resonant circuit 8 on the upstream side is constructed so as to have a requisite LC product through the combination of the input-side coil 11, the floating capacitor 12a, and the input-side capacitor 12b, noise on the low frequency side can be effectively removed. That is, since a relatively large LC product can be set by the input-side coil 11 and the input-side capacitor 12b, noise on the low frequency side can be effectively removed while avoiding such problems that the signal waveform is distorted as the inductance L is set to an excessively large value, or a characteristic degradation occurs or an increase in cost is caused by an increase in manufacturing man-hours because a large floating capacitor is set.

Further, the LC parallel resonant circuit 9 on the downstream side preferably includes the coil 13 and the floating capacitor 14a naturally generated as a result of the formation of the coil 13, whereby noise on the high frequency side can be effectively removed. That is, the setting of the resonance frequency on the high frequency side can be readily realized by adjusting the capacitance of the floating capacitor 14a because a small LC product suffices. Further, the ratio of the floating capacitance may be small, which proves advantageous because the attenuation band of noise on the high frequency side is not narrowed. For example, the communication bands for portable telephones are 875 MHz to 885 MHz on the low frequency side and 2110 MHz to 2170 MHz on the high frequency side, so the communication band on the high frequency side is wider. According to the construction of the fifth preferred embodiment, noise on the high frequency side can be effectively removed.

Therefore, according to the fifth preferred embodiment, a requisite noise removable action can be secured for each frequency band even through the construction of each noise filter 3 is simpler than those of the first through fourth preferred embodiments.

Otherwise, the construction and effects of the fifth preferred embodiment are the same as those of the first preferred embodiment, so detailed description is omitted here to avoid repetition.

Next, a method of manufacturing the noise filter array according to the fifth preferred embodiment will be described. Since the manufacturing method according to the fifth preferred embodiment is basically the same as that of the first preferred embodiment, it will be described here briefly.

For example, as shown in FIG. 18, predetermined numbers of the input-side-coil-forming insulating sheets 31, output-side-coil-forming insulating sheets 32, capacitor-forming insulating sheets 33, 34, and interconnection insulating sheets (not shown) interposed between the respective insulating sheets 31, 32, 33, 34 as required, are prepared.

In this case, four coil conductors 16, 18 are disposed in the coil-forming insulating sheets 31, 32 in order to provide the coils 11, 13 in correspondence with the four signal wires 2, respectively. Further, of the capacitor-forming insulating sheets 33, 34, the capacitance-forming electrode 24 is disposed in the insulating sheet 33 on the upper side, and the shield electrode 23 is disposed in the insulating sheet 34 on the lower side. Further, a total of four shield electrodes 23 and four capacitance-forming electrodes 24 are arranged in parallel in correspondence with the four signal wires 2. Further, of the insulating sheets 31 to 34, the via hole 20 or the like is formed in predetermined insulating sheets so as to provide electrical connection between the upper and lower sheets.

Further, after laminating predetermined numbers of the output-side-coil-forming insulating sheets 32, capacitor-forming insulating sheets 33, 34, and input-side-coil-forming insulating sheets 31, and, as required, interposing the interconnection insulating sheets (not shown) between the respective insulating sheets 31 to 34, the laminate of these insulating sheets is integrally fired.

Thereafter, on both side portions (outer left and right portions) of the insulator 4 thus obtained, the external electrodes 6, 7 are formed in correspondence with the respective signal wires 2. Thus, the noise filter array according to the fifth preferred embodiment having the construction as shown in FIG. 16 and having and equivalent circuit as shown in FIG. 17 is obtained.

Sixth Preferred Embodiment

Figure 19:
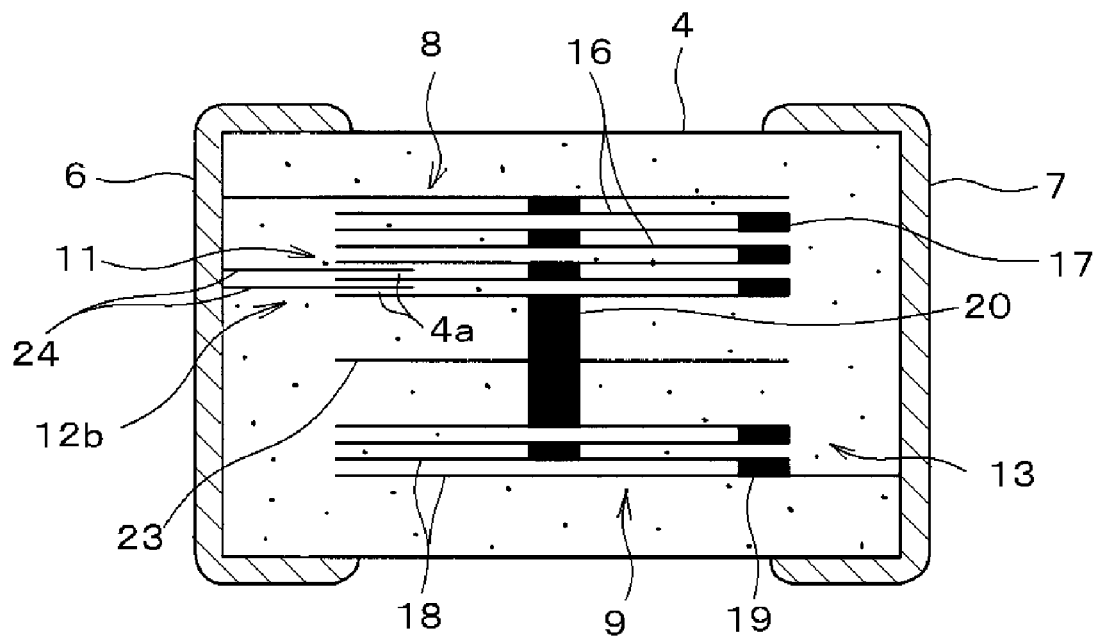
FIG. 19 is a sectional view showing the construction of a noise filter array according to a preferred embodiment of the present invention.

FIG. 19 is a sectional view of a noise filter array according to the sixth preferred embodiment of the present invention. In FIG. 19, the portions that are denoted by the same reference numerals as those of FIGS. 1 to 4 indicate portions that are the same as or equivalent to those of the noise filter array according to the first preferred embodiment.

The noise filter array according to the sixth preferred embodiment preferably has the same equivalent circuit as that shown in FIG. 17.

However, in the noise filter array according to the sixth preferred embodiment, the input-side capacitor 12b is preferably formed by arranging the capacitance-forming electrodes 24 so as to be opposed to a portion of the coil conductors 16 forming the input-side coil 11 through the insulator 4 (insulator layers 4a).

That is, the input-side capacitor 12b is formed by arranging the capacitance-forming electrodes 24 so as to be opposed to a portion of the output side of the coil conductors 16 forming the input-side coil 11 through the insulator 4 (insulator layers 4a). Further, one end of each of the capacitance-forming electrodes 24 is led out to one end side (outer left side portion) of the insulator 4 to be electrically connected to the external electrode 6.

Accordingly, with respect to the input-side coil 11, the floating capacitor 12a (see FIG. 17), which is naturally generated between the coil conductors (coil conductor layers) 16 as a result of the formation of the coil 11, and the input-side capacitor 12b generated by the capacitance-forming electrodes 24 are both connected in parallel, thereby forming the LC parallel resonant circuit 8 on the low frequency side. Further, the LC parallel resonant circuit 9 on the high frequency side includes the input-side coil 13, and the floating capacitor 14a (see FIG. 17) naturally generated between the coil conductors (coil conductor layers) 18 as a result of the formation of the coil 13.

Further, in the noise filter array according to the sixth preferred embodiment, by adjusting the surface area or the distance over which the capacitance-forming electrode 24 is opposed to each of the coil conductors 16 to thereby vary the capacitance of the input-side capacitor 12b, the resonance point of the LC parallel resonant circuit 8 on the low frequency side is adjusted to a resonance frequency at which noise is to be removed. It is also possible to adjust the resonance points of the respective LC parallel resonant circuits 8, 9 by adjusting the inductances of the input-side coil 11 and output-side coil 13 or by adjusting the capacitances of the floating capacitors 12a, 14a.

Further, in the sixth preferred embodiment, as in the fifth preferred embodiment, the shield electrode 23 is preferably provided between the input-side coil 11 on the upper side and the output-side coil 13 on the lower side, and is electrically connected to the via hole 20 that provides serial connection between the input-side coil 11 on the upper side and the output-side coil 13 on the lower side.

Otherwise, the construction and effects of the sixth preferred embodiment are the same as those of first preferred embodiment, so detailed description is omitted here to avoid repetition.

Seventh Preferred Embodiment

Figure 20:
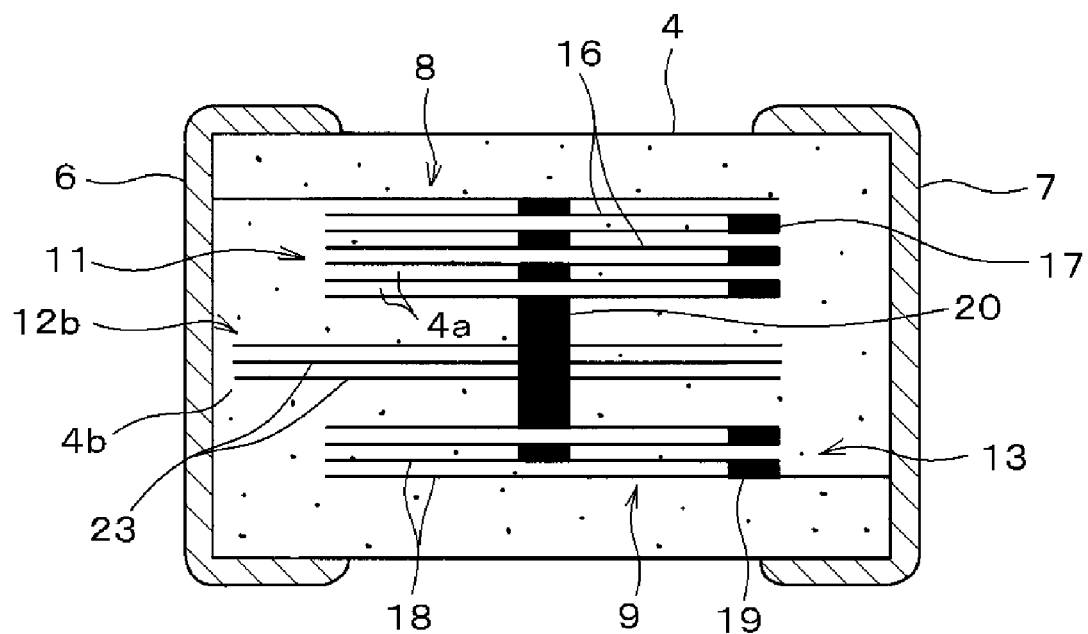
FIG. 20 is a sectional view showing the construction of a noise filter array according to a preferred embodiment of the present invention.

FIG. 20 is a sectional view of a noise filter array according to a seventh preferred embodiment of the present invention. In FIG. 20, the portions that are denoted by the same reference numerals as those of FIGS. 1 to 4 indicate portions that are the same as or equivalent to those of the noise filter array according to the first preferred embodiment.

The noise filter array according to the seventh preferred embodiment has the same equivalent circuit as that shown in FIG. 17.

However, in the noise filter array according to the seventh preferred embodiment, the input-side capacitor 12b preferably includes the external electrode 6 for signal input/output, which is formed on one end side (outer left side portion) of the insulator 4 in correspondence with each of the signal wires 2, and the shield electrodes 23 located between the upstream and downstream coils 11, 13, the shield electrodes 23 being substantially perpendicular to the coil axis direction and electrically connected to the coils 11, 13 through via hole 20.

That is, the input-side capacitor 12b preferably includes the input-side external electrode 6, and the shield electrodes 23 opposed to the input-side external electrode 6 through the insulator 4 (insulator layers 4a). Accordingly, with respect to the input-side coil 11, the floating capacitor 12a (see FIG. 17), which is naturally generated between the coil conductors (coil conductor layers) 16 as a result of the formation of the coil 11, and the input-side capacitor 12b generated by the shield electrodes 23 are both connected in parallel, thereby forming the LC parallel resonant circuit 8 on the low frequency side. Further, the LC parallel resonant circuit 9 on the high frequency side preferably includes the output-side coil 13, and the floating capacitor 14a (see FIG. 17) naturally generated between the coil conductors (coil conductor layers) 18 following the formation of the coil 13.

Further, in the noise filter array according to the seventh preferred embodiment, by adjusting the distance over which the respective external electrodes 6 and the shield electrodes 23 are opposed to each other or the like to thereby vary the capacitance of the input-side capacitor 12b, the resonance point of the LC parallel resonant circuit 8 on the low frequency side is adjusted to a resonance frequency at which noise is to be removed. It is also possible to adjust the resonance points of the respective LC parallel resonant circuits 8, 9 by adjusting the inductances of the input-side coil 11 and output-side coil 13 or by adjusting the capacitances of the floating capacitors 12a, 14a.

Otherwise, the construction and effects of the seventh preferred embodiment are the same as those of the fifth preferred embodiment, so detailed description is omitted here to avoid repetition.

While in each of various preferred embodiments described above, the description is directed to the case where the two upstream and downstream LC parallel resonant circuits 8, 9 are provided with respect to the respective signal wires 2, the present invention is not limited to this. It is also possible to adopt a construction in which three or more LC parallel resonant circuits are connected in tandem with respect to the respective signal wires 2. In that case, noise removing characteristics over an even wider band can be attained by setting the inductance L and the capacitance C as appropriate for each LC parallel resonant circuit so that an appropriate resonance frequency is obtained.

Further, while in each of the above-described various preferred embodiments, the description is directed to the case where the four noise filters 3 are combined in correspondence with the four signal wires 2 located on the circuit board 1 and integrated into a noise filter array, the number of the noise filters 3 is not particularly limited. The present invention is also applicable to cases where a single noise filter 3 is provided. Further, while in the fourth preferred embodiment as well the description is directed to the case where the four noise filters 3 are combined in correspondence with the four signal wires 2 and integrated into a noise filter array, in this case, too, the number of signal wires 2 or the number of noise filters 3 is not particularly limited.

In other respects as well, the present invention is not restricted to the preferred embodiments of the present invention described above but can be subject to various applications and modifications within the scope of the present invention.

According to the present invention, it is possible to provide a noise filter which makes it possible to easily and reliably set a resonance frequency in each of a plurality of frequency bands and which is capable of efficiently removing noise in each of the plurality of frequency bands, and also, a noise filter which makes it possible to attain a high attenuation at each resonance frequency by reliably preventing magnetic coupling between the coils, and a noise filter array including such a noise filter.

The noise filter and the noise filter array according to various preferred embodiments of the present invention can be suitably used for applications such as removal of noise in portable telephones, and further can be used for a wide variety of other applications (for example, applications such as removal of noise in other high-frequency circuits).

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A noise filter for removing noise flowing in a signal wire located on a circuit board, the noise filter comprising:
   an insulator;
   a pair of external electrodes that are connected to the signal wire and are disposed on an outside of the insulator;
   a plurality of coils connected in series, disposed inside of the insulator, and having both ends thereof electrically connected to the external electrodes, respectively; and
   a capacitor connected in parallel to at least one of the plurality of coils; wherein
   each of the plurality of coils includes a plurality of coil conductors disposed in the insulator, the plurality of coil conductors being arranged in a spiral configuration and connected to each other through a via hole; and
   the capacitor includes a shield electrode and a capacitance-forming electrode opposed to each other through the insulator, the shield electrode being located between upstream and downstream coils of the plurality of coils and commonly electrically connected to both the upstream and downstream coils, the capacitance-forming electrode being electrically connected to one of the pair of external electrodes.

2. The noise filter according to claim 1, wherein the shield electrode has a surface area that is equal to or greater than about ½ of a surface area of a bore of at least one of the upstream and downstream coils.

3. The noise filter according to claim 1, wherein a plurality of LC parallel resonant circuits having different resonance frequencies are defined by the plurality of coils and the capacitor individually connected in parallel to each of the plurality of coils.

4. The noise filter according to claim 1, wherein an LC parallel resonant circuit on a low frequency side is defined by one of the plurality of coils, the capacitor connected in parallel to the one of the plurality of coils, and a floating capacitor generated due to the presence of the one of the plurality of coils, and an LC parallel resonant circuit on a high frequency side is defined by another one of the plurality of coils and a floating capacitor generated due to the presence of the another one of the plurality of coils.

5. A noise filter array comprising a plurality of the noise filters according to claim 1, wherein the plurality of the noise filters are integrated together while being arranged in an array individually in correspondence with a plurality of signal wires located on a circuit board.

6. The noise filter array according to claim 5, wherein connecting points between the plurality of coils provided for each of the signal wires are commonly connected together in an ungrounded state via a noise dispersing capacitor.

7. A noise filter for removing noise flowing in a signal wire located on a circuit board, the noise filter comprising:
   an insulator;
   a pair of external electrodes that are connected to the signal wire and are disposed on an outside of the insulator;
   a plurality of coils connected in series, disposed inside of the insulator, and having both ends thereof electrically connected to the external electrodes, respectively; and
   a capacitor connected in parallel to at least one of the plurality of coils; wherein
   each of the plurality of coils includes a plurality of coil conductors disposed in the insulator, the plurality of coil conductors being arranged in a spiral configuration and connected to each other through a via hole; and
   the capacitor includes the plurality of coil conductors and a capacitance-forming electrode arranged so as to be opposed to each other through the insulator, the capacitance-forming electrode being electrically connected to one of the pair of external electrodes.

8. The noise filter according to claim 7, wherein a shield electrode is disposed between upstream and downstream coils of the plurality of coils so as to be substantially perpendicular to a coil axis direction of the plurality of coils.

9. The noise filter according to claim 8, wherein the shield electrode has a surface area that is equal to or greater than about ½ of a surface area of a bore of at least one of the upstream and downstream coils.

10. The noise filter according to claim 7, wherein a plurality of LC parallel resonant circuits having different resonance frequencies are defined by the plurality of coils and the capacitor individually connected in parallel to each of the plurality of coils.

11. The noise filter according to claim 7, wherein an LC parallel resonant circuit on a low frequency side is defined by one of the plurality of coils, the capacitor connected in parallel to the one of the plurality of coils, and a floating capacitor generated due to the presence of the one of the plurality of coils, and an LC parallel resonant circuit on a high frequency side is defined by another one of the plurality of coils and a floating capacitor generated due to the presence of the another one of the plurality of coils.

12. A noise filter array comprising a plurality of the noise filters according to claim 7, wherein the plurality of the noise filters are integrated together while being arranged in an array individually in correspondence with a plurality of signal wires located on a circuit board.

13. The noise filter array according to claim 12, wherein connecting points between the plurality of coils provided for each of the signal wires are commonly connected together in an ungrounded state via a noise dispersing capacitor.

14. A noise filter for removing noise flowing in a signal wire located on a circuit board, the noise filter comprising:
   an insulator;
   a pair of external electrodes that are connected to the signal wire and are disposed on an outside of the insulator;
   a plurality of coils connected in series, disposed inside of the insulator, and having both ends thereof electrically connected to the external electrodes, respectively; and
   a capacitor connected in parallel to at least one of the plurality of coils; wherein
   each of the plurality of coils includes a plurality of coil conductors disposed in the insulator, the plurality of coil conductors being arranged in a spiral configuration and connected to each other through a via hole; and
   the capacitor includes one of the pair of external electrodes and a shield electrode arranged so as to be opposed to each other through the insulator, the shield electrode being located between upstream and downstream coils of the plurality of coils and electrically connected to both the upstream and downstream coils.

15. The noise filter according to claim 14, wherein the shield electrode has a surface area that is equal to or greater than about ½ of a surface area of a bore of at least one of the upstream and downstream coils.

16. The noise filter according to claim 14, wherein a plurality of LC parallel resonant circuits having different resonance frequencies are defined by the plurality of coils and the capacitor individually connected in parallel to each of the plurality of coils.

17. The noise filter according to claim 14, wherein an LC parallel resonant circuit on a low frequency side is defined by one of the plurality of coils, the capacitor connected in parallel to the one of the plurality of coils, and a floating capacitor generated due to the presence of the one of the plurality of coils, and an LC parallel resonant circuit on a high frequency side is defined by another one of the plurality of coils and a floating capacitor generated due to the presence of the another one of the plurality of coils.

18. A noise filter array comprising a plurality of the noise filters according to claim 14, wherein the plurality of the noise filters are integrated together while being arranged in an array individually in correspondence with a plurality of signal wires located on a circuit board.

19. The noise filter array according to claim 18, wherein connecting points between the plurality of coils provided for each of the signal wires are commonly connected together in an ungrounded state via a noise dispersing capacitor.

* * * * *